(12) United States Patent
Katou

(10) Patent No.: US 7,755,931 B2
(45) Date of Patent: Jul. 13, 2010

(54) MAGNETIC RANDOM ACCESS MEMORY AND OPERATION METHOD THEREOF

(75) Inventor: Yuukou Katou, Tokyo (JP)

(73) Assignee: NEC Corporation, Tokyo (JP)

( * ) Notice: Subject to any disclaimer, the term of this patent is extended or adjusted under 35 U.S.C. 154(b) by 259 days.

(21) Appl. No.: 11/996,073

(22) PCT Filed: Jul. 13, 2006

(86) PCT No.: PCT/JP2006/313988

§ 371 (c)(1),
(2), (4) Date: Jan. 18, 2008

(87) PCT Pub. No.: WO2007/015358

PCT Pub. Date: Feb. 8, 2007

(65) Prior Publication Data

US 2009/0109736 A1    Apr. 30, 2009

(30) Foreign Application Priority Data

Aug. 2, 2005 (JP) .............................. 2005-224096

(51) Int. Cl.
*G11C 11/00* (2006.01)
(52) U.S. Cl. .................... 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 6,111,783 A * | 8/2000 | Tran et al. .................. 365/171 |
| 6,545,906 B1 | 4/2003 | Savtchenko et al. |
| 6,873,544 B2 | 3/2005 | Perner et al. |
| 7,006,371 B2 | 2/2006 | Matsuoka |
| 7,224,628 B2 | 5/2007 | Yang et al. |
| 7,239,539 B2 | 7/2007 | Moriyama et al. |
| 7,239,568 B2 * | 7/2007 | Perner et al. ................ 365/209 |
| 2004/0088471 A1 | 5/2004 | Perner et al. |

FOREIGN PATENT DOCUMENTS

JP    2002-140889    5/2002

(Continued)

OTHER PUBLICATIONS

Grollier et al., "Spin-polarized current induced switching in Co/Cu/Co pillars," Appl. Phys. Lets., vol. 78, pp. 3663-3665 (Jun. 4, 2001).

(Continued)

*Primary Examiner*—Son Dinh
*Assistant Examiner*—Nam Nguyen
(74) *Attorney, Agent, or Firm*—Young & Thompson

(57) ABSTRACT

The MRAM includes: a memory cell 10 including a magnetoresistance element 1, a current supply circuit and a controller. The current supply circuit supplies, to the magnetoresistance element 1, a write current IW in a direction corresponding to data to be written into the memory cell 10. The controller controls supply of the write current IW from the current supply circuit. The controller also determines whether or not a data is written into the memory cell 10 during a predetermined write period PW in which the write current IW is supplied. The controller instructs the current supply circuit to finish supplying the write current IW when determining that the data is written into the memory cell (10).

48 Claims, 24 Drawing Sheets

FOREIGN PATENT DOCUMENTS

| | | |
|---|---|---|
| JP | 2003-007985 | 1/2003 |
| JP | 2003-115577 | 4/2003 |
| JP | 2003-272375 | 9/2003 |
| JP | 2003-346475 | 12/2003 |
| JP | 2004-5972 | 1/2004 |
| JP | 2004-193346 | 7/2004 |
| JP | 2004-234707 A | 8/2004 |
| JP | 2005-50424 A | 2/2005 |
| JP | 2005-050907 | 2/2005 |
| JP | 2005-150482 | 6/2005 |
| JP | 2005-166896 | 6/2005 |
| JP | 2005-175374 | 6/2005 |
| JP | 2005-203443 | 7/2005 |
| JP | 2006-31923 A | 2/2006 |

OTHER PUBLICATIONS

Yagami et al., "Research Trends in Spin Transfer Magnetization Switching," J. of Mag. Soc. of Jap., vol. 28, No. 9, pp. 937-948 (2004).

2000 IEEE International Solid-State Circuits Conference Digest of Technical Papers, p. 128.

2000 IEEE International Solid-State Circuits Conference Digest of Technical Papers, p. 130.

* cited by examiner

MAGNETIC RANDOM ACCESS MEMORY AND OPERATION METHOD THEREOF

TECHNICAL FIELD

The present invention relates to a magnetic random access memory and an operation method thereof. More specifically, the present invention relates to a write control in a magnetic random access memory.

BACKGROUND ART

A MRAM (magnetic random access memory) is regarded as a nonvolatile memory which is favorable from a viewpoint of high integration and high-speed operation (e.g. refer to Japanese Laid-Open Patent Applications JP-P 2003-272375A, JP-P 2002-140889A, JP-P 2004-5972A, JP-P 2003-346475A and so on). In the MRAM, magnetic resistance elements are utilized which exhibit a "magnetoresistance effect" such as a TMR (tunnel magnetoresistance) effect. For example, an MTJ (magnetic tunnel junction) in which a tunnel barrier layer is held between two-layer ferromagnetic layers is formed in the magnetoresistance elements. The two-layer ferromagnetic layers are made of a pinned layer whose magnetization orientation is fixed and a free layer whose magnetization orientation can be switched.

It is known that a resistance value (R+ΔR) of the MTJ when the magnetization orientation of the free layer is "antiparallel" to that of the pinned layer is larger than a resistance value (R) of the MTJ when the magnetization orientation of the free layer is "parallel" to that of the pinned layer due to the magnetoresistance effect. The MRAM uses the magnetoresistance elements having the MTJ as memory cells, and stores data by using variations of a resistance value of the magnetoresistance element in a nonvolatile manner. Data is written into the memory cell by switching the magnetization orientation of the free layer.

An asteroid method and a toggle method have been known as a method to write data with respect to the MRAM. According to these write methods, a switching magnetic field required to switch magnetization of the free layer increases in substantially inverse proportion to a size of the memory cell. That is, a write current tends to increase based on miniaturization of the memory cell.

A write method is proposed, which can suppress an increase in the write current accompanied by the miniaturization. The method is a spin transfer method (e.g. refer to Grollier et al, "Spin-polarized current induced switching in Co/Cu/Co pillars", Applied Physics Letters, Vol. 78, pp. 3663, 2001; Yagami and Suzuki, "Research Trends in Spin Transfer Magnetization Switching", Journal of magnetic society of Japan, Vol. 28, No. 9, 2004). According to the spin transfer method, a spin-polarized current is transferred to a ferromagnetic conductor, so that magnetization is switched by a direct interaction between spin of conductive electrons which carry the current and magnetic moment of the conductor (referred to as a "spin transfer magnetization switching" hereinafter). An outline of the spin transfer magnetization switching will be explained referring to FIG. 1.

In FIG. 1, a magnetoresistance element 1 is provided with a free layer 2 and a pinned layer 4 as magnetic material layers, and a tunnel barrier layer 3 as a nonmagnetic material layer which is held between the free layer 2 and the pinned layer 4. Here, the pinned layer 4 whose magnetization orientation is fixed is formed to be thicker than the free layer 2, serving as a spin filter, i.e. a mechanism to create a spin-polarized current. A state of having a parallel magnetization orientation between the free layer 2 and the pinned layer 4 is made to correspond to data "0", while a state of having an antiparallel magnetization orientation therebetween is made to correspond to data "1".

The spin transfer magnetization switching as shown in FIG. 1 is realized by a CPP (current perpendicular to plane) method, where a write current IW is vertically transferred to a film plane. More specifically, in transition from the data "0" to data "1", a write current IW is made to flow from the pinned layer 4 to the free layer 2. In this case, electrons having the same spin state as that of electrons in the pinned layer 4 as the spin filter move from the free layer 2 to the pinned layer 4. Magnetization of the free layer 2 is then switched by spin transfer effects brought by supplying and receiving spin angular momentum. In transition from the data "1" to data "0", the write current IW is made to flow from the free layer 2 to the pinned layer 4. In this case, electrons having the same spin state as that of electrons in the pinned layer 4 as the spin filter move from the pinned layer 4 to the free layer 2. The magnetization of the free layer 2 is switched by the spin transfer effects.

Data is thus written by movement of spin electrons in the spin transfer magnetization switching. A magnetization orientation of the free layer 2 can be defined by a direction of a spin-polarized current which is vertically transferred to the film plane. A write (i.e. magnetization switching) threshold value here is known as being dependent on current density. Accordingly, a write current which is required to switch magnetization decreases based on a size decrease of a memory cell. Since miniaturization of a memory cell is accompanied by a decrease in the write current, the spin transfer magnetization switching is important to realize a MRAM having a large capacity.

It is necessary for any write method to change a magnetization state of the free layer in a write operation of the MRAM. Therefore, there is a probability that desired data is not written into a memory cell (referred to as a "probability of erroneous writing" hereinafter). An increase in the probability of erroneous writing is caused by a decreased write current to suppress power consumption and a shortened write time to realize high speed operation.

Japanese Laid-Open Patent Application JP-P 2003-115577A discloses a recording/reproducing method of a nonvolatile magnetic thin film memory device aimed to suppress write failures. According to the recording/reproducing method, test writing is carried out in a memory cell used for test writing before recording data. After confirming a record of the test writing, actual data is written. In this case, although an amount of time to write data increases, a probability of performing a normal write operation increases even in different temperature environment circumstances.

DISCLOSURE OF INVENTION

An object of the present invention is to provide a magnetic random access memory using a spin transfer method, capable of reducing power consumption and an operation method thereof.

Another object of the present invention is to provide a magnetic random access memory using a spin transfer method, capable of reducing a probability of erroneous writing and an operation method thereof.

Another object of the present invention is to provide a magnetic random access memory using a spin transfer method, capable of suppressing an increase in an amount of time to write data and an operation method thereof.

Another object of the present invention is to provide a magnetic random access memory using a spin transfer method, capable of suppressing reduction in an operation speed and an operation method thereof.

This and other objects, features and advantages of the present invention will be readily ascertained by referring to the following description and drawings.

According to a first aspect of the present invention, an operation method of a MRAM includes: (A) supplying a write current to a memory cell having a magnetoresistance element so as to write a desired data on the basis of a spin transfer method; and (B) determining whether or not the desired data is written into the memory cell. The aforementioned step (B) is executed during the aforementioned step (A).

The operation method further includes: (C) finishing supply of the write current when determining that the desired data is written into the memory cell. Therefore, power consumption is reduced. It is also preferable to increase the write current in terms of time in the aforementioned step (A).

The aforementioned step (B) includes: (B1) monitoring an electrical potential in a predetermined position of a wiring in which the write current flows; and (B2) carrying out the aforementioned determination by comparing the electrical potential with a reference potential and detecting whether or not the electrical potential exhibits a value corresponding to the desired data.

The aforementioned step (B2) may also be carried out during the aforementioned step (A) in real time.

The operation method according to the present invention may further include: (D) extending a period of the aforementioned step (A) when determining that the desired data is not written into the memory cell before the aforementioned step (A) finishes. Alternatively, the operation method may further include: (E) rewriting the desired data into the memory cell when determining that the desired data is not written into the memory cell before the aforementioned step (A) finishes. Therefore, a probability of erroneous writing can be reduced.

The aforementioned step (B2) may also be carried out at a predetermined timing during the aforementioned step (A).

The operation method according to the present invention may further include: (D) extending a period of the aforementioned step (A) when determining that the desired data is not written into the memory cell at the predetermined timing. Alternatively, the operation method may further include: (E1) finishing the aforementioned step (A) when determining that the desired data is not written into the memory cell at the predetermined timing; and (E2) rewriting the desired data into the memory cell. Therefore, a probability of erroneous writing can be reduced.

The aforementioned step (B) may also include: (B1) calculating a ratio between an electrical potential in a predetermined position of a wiring in which the write current flows and the write current; and (B2) carrying out the aforementioned determination by comparing the ratio with a reference value and detecting whether or not the ratio exhibits a value corresponding to the desired data.

The aforementioned step (B2) may also be carried out during the aforementioned step (A) in real time.

The operation method according to the present invention may further include: (D) extending a period of the aforementioned step (A) when determining that desired data is not written into the memory cell before the aforementioned step (A) finishes. In the aforementioned step (D), it is preferable to increase the write current in terms of time. Alternatively, the operation method may further include: (E) rewriting the desired data into the memory cell by supplying a rewrite current to the memory cell when determining that the desired data is not written into the memory cell before the aforementioned step (A) finishes. It is preferable that the rewrite current in the aforementioned step (E) is larger than the write current in the aforementioned step (A). It is also preferable that the rewrite current increases in terms of time in the aforementioned step (E). Therefore, a probability of erroneous writing can be reduced.

The aforementioned step (B2) may also be carried out at a predetermined timing during the aforementioned step (A).

The operation method according to the present invention may further include: (D) increasing the write current in terms of time when determining that desired data is not written into the memory cell at the predetermined timing. A period of the aforementioned step (A) may also be extended. Alternatively, the operation method may further include: (E1) finishing the aforementioned step (A) when determining that the desired data is not written into the memory cell at the predetermined timing; and (E2) rewriting the desired data into the memory cell by supplying a rewrite current to the memory cell. It is preferable that the rewrite current in the aforementioned step (E2) is larger than the write current in the aforementioned step (A). It is also preferable that the rewrite current increases in terms of time in the aforementioned step (E2). Therefore, a probability of erroneous writing can be reduced.

The operation method according to the present invention may further include: (F) applying a bias magnetic field corresponding to the desired data to the magnetoresistance elements at the same time with the aforementioned step (A).

According to a second aspect of the present invention, an MRAM using a spin transfer method is provided. The MRAM includes: a memory cell including a magnetoresistance element, a current supply circuit and a controller. The current supply circuit supplies, to the magnetoresistance element, a write current in a direction corresponding to data to be written into the memory cell. The controller controls supply of the write current from the current supply circuit. The controller also determines whether or not data is written into the memory cell during a predetermined write period in which the write current is supplied.

In the MRAM according to the present invention, the controller instructs the current supply circuit to finish supplying the write current when determining that the data is written into the memory cell. Therefore, power consumption can be reduced. It is also preferable that the controller instructs the current supply circuit to increase the write current in terms of time during the predetermined write period.

The controller may include a comparator comparing an electrical potential in a predetermined position of a wiring in which the write current flows with the reference potential. The comparator carries out the aforementioned determination in real time by detecting whether or not the electrical potential exhibits a value corresponding to the data on the basis of the aforementioned comparison. When determining that the data is not written into the memory cell before the predetermined write period finishes, the controller may also instruct the current supply circuit to extend a period in which the write current is supplied. Alternatively, the controller may also instruct the current supply circuit to supply the write current again. Therefore, a probability of erroneous writing can be reduced.

The controller may also include a potential monitor monitoring an electrical potential in a predetermined position of a wiring in which the write current flows. In this case, the controller carries out the aforementioned determination by determining whether or not the electrical potential exhibits a value corresponding to the data at a predetermined timing during the predetermined write period. When determining that the data is not written into the memory cell at the predetermined timing, the controller may instruct the current supply circuit to extend a period in which the write current is supplied. Alternatively, the controller may also instruct the current supply circuit to supply the write current again after finishing supplying the write current. Therefore, a probability of erroneous writing can be reduced.

The controller may also includes a calculating unit calculating a ratio between an electrical potential in a predetermined position of a writing in which the write current flows and the write current so as to compare the ratio with a reference value. The calculating unit carries out the aforementioned determination in real time by detecting whether or not the ratio exhibits a value corresponding to the data on the basis of the aforementioned comparison. When determining that the data is not written into the memory cell before the predetermined write period finishes, the controller may also instruct the current supply circuit to extend a period in which the write current is supplied. In this case, it is preferable that the controller instructs the current supply circuit to increase the write current in terms of time in an extended period. Alternatively, the controller may also instruct the current supply circuit to supply the rewrite current. In this case, it is preferable that the rewrite current is larger than the write current. The rewrite current may also increase in terms of time. Therefore, a probability of erroneous writing can be reduced.

The controller may also include a calculating unit calculating a ratio between an electrical potential in a predetermined position of the wiring in which the write current flows and the write current. In this case, the controller carries out the determination by judging whether or not the ratio exhibits a value corresponding to the data at a predetermined timing during the predetermined write period. When determining that the data is not written into the memory cell at the predetermined timing, the controller may also instruct the current supply circuit to increase the write current in terms of time. A period to supply the write current may also be extended. Alternatively, the controller may also instruct the current supply circuit to supply the rewrite current after finishing supply of the write current. In this case, it is preferable that the rewrite current is larger than the write current. The rewrite current may also increase in terms of time. Therefore, a probability of erroneous writing can be reduced.

The MRAM according to the present invention may be further includes a write line magnetically coupled with the magnetoresistance element, and an auxiliary current supply circuit supplying an auxiliary write current to the write line. A magnetic field generated by the auxiliary write current is applied to the magnetoresistance element. The controller instructs the auxiliary current supply circuit to supply an auxiliary write current simultaneously with supply of the write current (IW).

BEST MODE FOR CARRYING OUT THE INVENTION

A MRAM (magnetic random access memory) and an operation method thereof according to the present invention will be explained referring to accompanying drawings. In the MRAM according to the present invention, data is written by a "spin transfer method".

Figure 2:
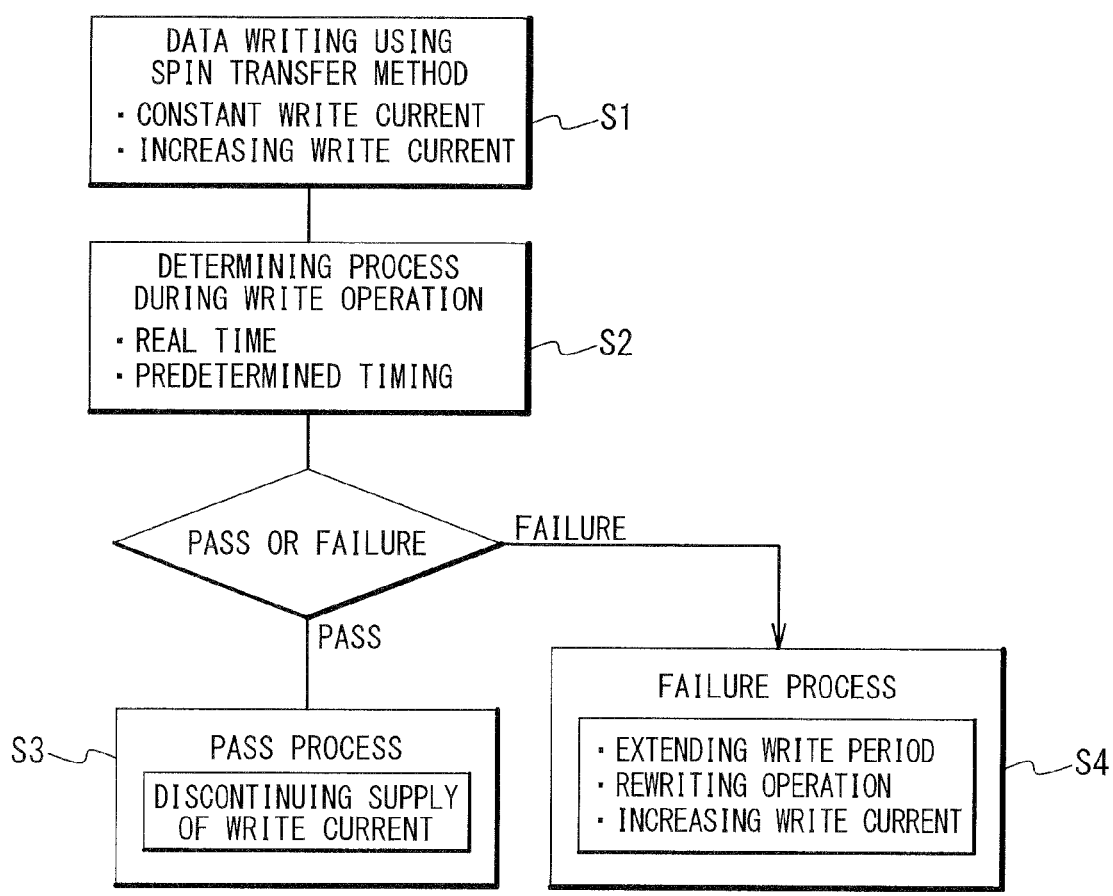
FIG. 2 is a flowchart showing a summary of a write control according to the present invention.

FIG. 2 is a flowchart showing a summary of a procedure of writing data of embodiments according to the present invention. First, a desired data is written into a subject memory cell on the basis of the spin transfer method during a predetermined write period (step S1). A value of a write current here may be fixed or increase in terms of time. During the predetermined write period, it is determined whether or not desired data was written into the subject memory cell (step S2). It may be determined in real time during one of the predetermined write period or at a predetermined timing during the predetermined write period.

When the desired data is written into the subject memory cell (i.e. Pass), a pass process is executed (step S3). Specifically, it is discontinued to supply the write current even in the predetermined write period so as to finish the write process. In contrast, when the desired data is not written into the subject memory cell (i.e. Failure), a failure process is executed (step S4). For example, a control is made so as to extend the write period, execute a rewrite process, or increase a write current in terms of time.

A circuit configuration example provided to realize the procedure shown in FIG. 2 and a write control method will be explained below in detail according to the present invention.

1. FIRST EMBODIMENT

1-1. Circuit Configuration

Figure 1:
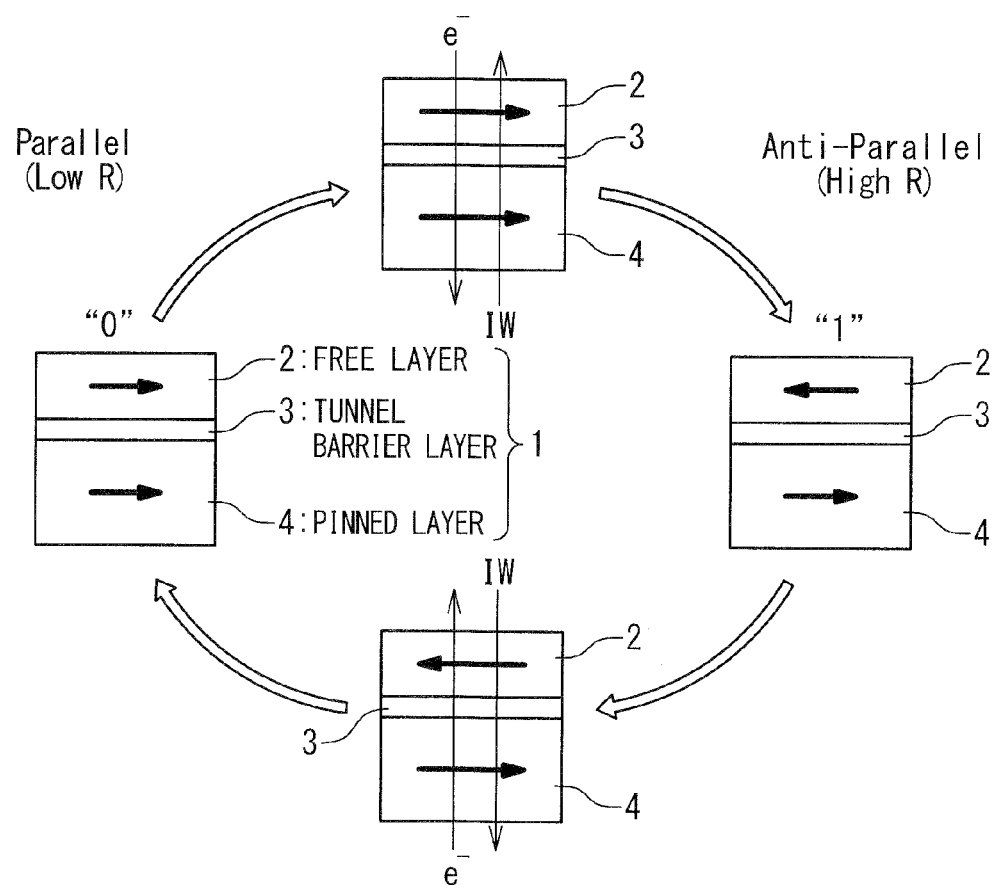
FIG. 1 is a diagram explaining spin transfer magnetization switching.
Figure 3:
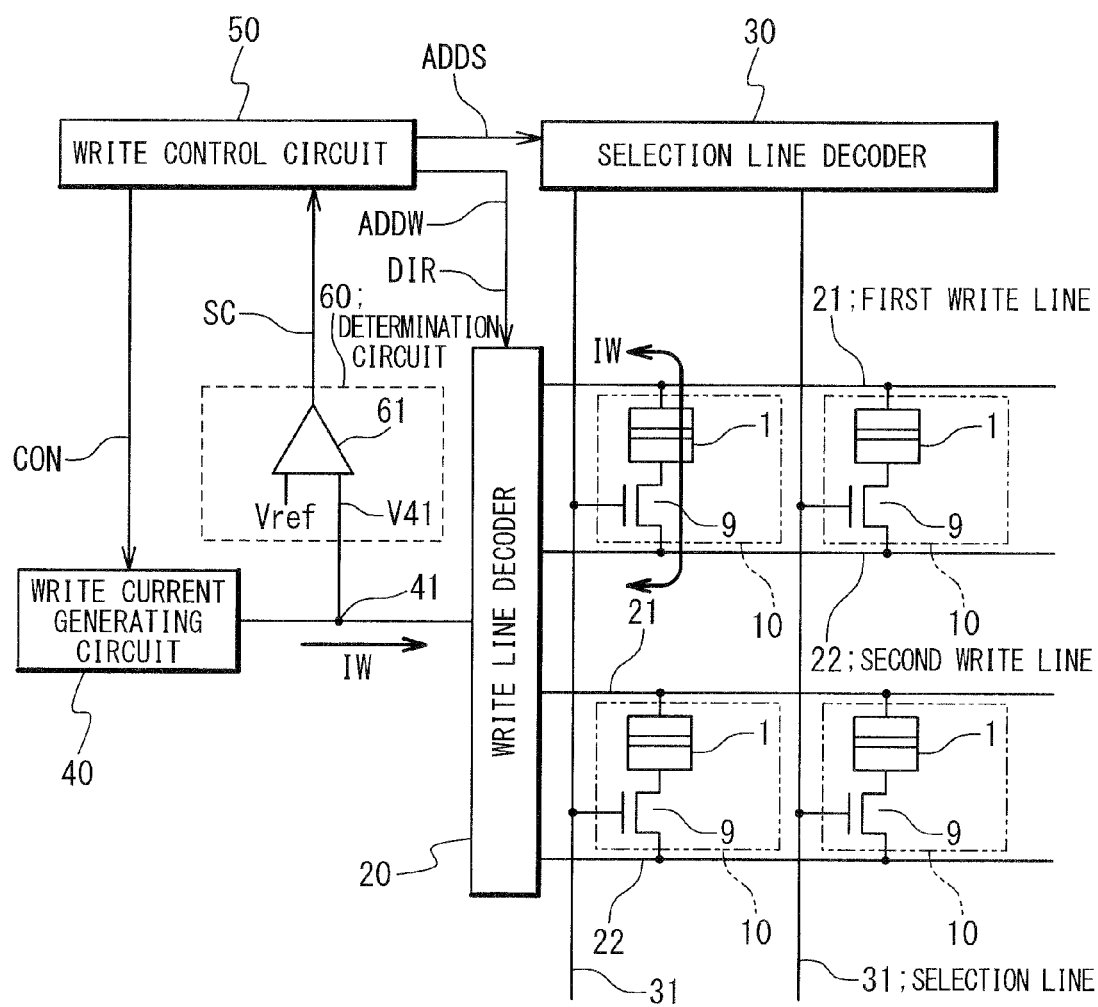
FIG. 3 is a circuit block diagram showing a configuration of an MRAM of a first embodiment according to the present invention.

FIG. 3 is a circuit block diagram showing a configuration of a MRAM of a first embodiment according to the present invention. The MRAM includes a memory cell array including a plurality of memory cells 10 arranged in a matrix form. Each of the memory cells 10 includes a magnetoresistance element 1 shown in FIG. 1 and a selection transistor 9. As shown in FIG. 1, the magnetoresistance element 1 includes a free layer 2, a tunnel barrier 3, and a pinned layer 4. The pinned layer 4 whose magnetization orientation is fixed is formed to be thicker than the free layer 2, serving as a mechanism (a spin filter) to create a spin-polarized current. The desired data is written into the memory cell 10 by the write current IW that is vertically transferred into film planes of the magnetoresistance elements 1. A direction of the write current IW is determined by being dependent on desired data to be written.

One end of the magnetoresistance element 1 is connected to a first write line 21, while the other end thereof is connected to one of sources/drains of the selection transistor 9. The other source/drain of the selection transistor 9 is connected to a second write line 22. A gate of the selection transistor 9 is connected to a selection line 31. A plurality of the first write lines 21 and a plurality of the second write lines 22 are connected to a write line decoder 20. A plurality of the selection lines 31 is connected to a selection line decoder 30.

The MRAM further includes a write current generating circuit 40 and a write control circuit 50.

The write current generating circuit 40 supplies the write current IW to the memory cell 10 through the write line decoder 20. The write control circuit 50 controls an operation of each of the circuits by supplying control signals to respective circuits.

The write current generating circuit 40 receives a write control signal CON used for adjusting the write current IW from the write control circuit 50. The write current generating circuit 40 supplies, modifies, discontinues the write current IW in response to the write control signal CON.

The selection line decoder (or selection line driver) 30 receives, from the write control circuit 50, a selection line address signal ADDS related to an address of the subject memory cell. The selection line decoder 30 drives one of the selection lines 31 connected to the subject memory cell on the basis of the selection line address signal ADDS. Therefore, the selection transistor 9 of the subject memory cell is turned on.

The write line decoder (write line driver) 20 receives, from the write control circuit 50, a current direction signal DIR which indicates a direction of the write current IW. The direction of the write current IW is determined by being dependent on data which is written into the subject memory cell. The write line decoder 20 also receives, from the write control circuit 50, a write line address ADDW related to the address of the subject memory cell. The write line decoder 20 drives the first write line 21 and the second write line 22 which is connected to the subject memory cell on the basis of the write line address signal ADDW. Therefore, the write current IW outputted from the write current generating circuit 40 flows in the memory cell 10 (i.e. magnetoresistance elements 1) so as to be consistent with a direction indicated by the current direction signal DIR.

Figure 4:
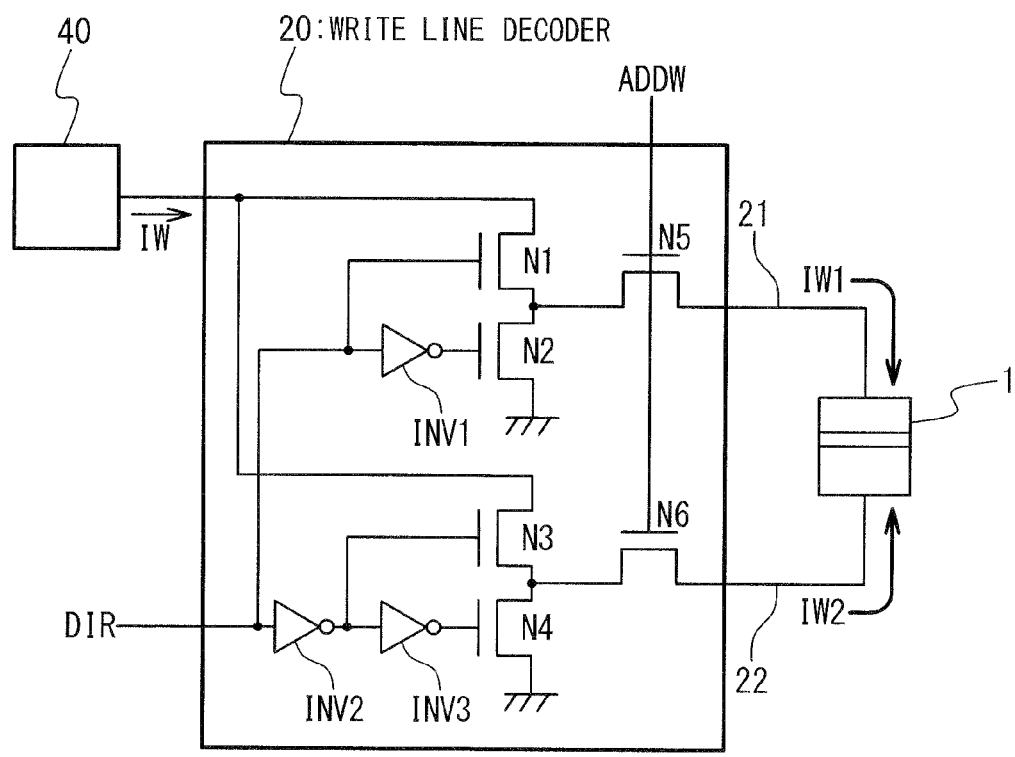
FIG. 4 is a circuit diagram showing a configuration example of a write line decoder according to the first embodiment.

FIG. 4 shows an example of the write line decoder 20 for supplying the write current IW in a direction to be consistent with that of the current direction signal DIR. FIG. 4 shows a configuration with respect to one write line 21 and one write line 22, i.e. one magnetoresistance element 1. The write line decoder 20 includes inverters INV1 to INV3 and N-channel transistors N1 to N6. The first write line 21 is connected to the write current generating circuit 40 via the N-channel transistors N1 and N5. The first write line 21 is also connected to a ground via the N-channel transistors N2 and N5. The second write line 22 is connected to the write current generating circuit 40 via the N channel transistors N3 and N6. The second write line 22 is also connected to the ground via the N-channel transistors N4 and N6.

The write line address signal ADDW is supplied to gates of the N-channel transistors N5 and N6. When the write line address signal ADDW exhibits "high", one first write line 21 and one second write line 22 shown in FIG. 4 are selected. The current direction signal DIR is supplied to a gate of the N-channel transistor N1, and also supplied to a gate of the N-channel transistor N2 via the inverter IN1. The current direction signal DIR is further supplied to a gate of the N-channel transistor N3 via the inverter INV2, and also supplied to a gate of the N-channel transistor N4 via the inverters INV2 and INV3.

When the current direction signal DIR exhibits "high", the N-channel transistors N1 and N4 are turned on, while the N-channel transistors N2 and N3 are turned off. Therefore, the first write line 21 and the write current generating circuit 40 are electrically connected, while the second write line 22 and the ground are electrically connected. As a result, the write current IW (i.e. first write current IW1) flows from the first write line 21 to the second write line 22 by passing through the magnetoresistance element 1. In contrast, when the current direction signal DIR exhibits "low", the N-channel transistors N2 and N3 are turned on, while the N-channel transistors N1 and N4 are turned off. Therefore, the first write line 21 and the ground are electrically connected, while the second write line 22 and the write current generating circuit 40 are electrically connected. As a result, the write current IW (i.e. second write current IW2) flows from the second write line 22 to the first write line 21 by passing through the magnetoresistance element 1.

Referring to FIG. 3, the MRAM according to the present embodiment further includes a determination circuit 60. The determination circuit 60 is a circuit which carries out a process of the step S2 as shown in FIG. 2. That is, the determination circuit 60 is provided to detect a resistance value of the magnetoresistance element 1 of the subject memory cell so as to determine whether or not the desired data is written into the subject memory cell.

In order to detect a resistance value of the magnetoresistance element 1, for example, an electrical potential obtained in a predetermined position of a wiring in which the write current IW flows shall be used. An electrical potential V41 in a node 41 disposed between the write current generating circuit 40 and the write line decoder 20 is used as an example in FIG. 3. When the write current IW is constant, the electrical potential V41 increases on the basis of an increase of a resistance value of the magnetoresistance element 1, and the electrical potential V41 decreases on the basis of a decrease of the resistance value of the magnetoresistance element 1. That is, the electrical potential V41 reflects the resistance value of the magnetoresistance element 1. The determination circuit 60 determines whether or not the desired data is written into the subject memory cell on the basis of the electrical potential V41.

More specifically, the determination circuit 60 according to the present embodiment includes a comparator 61 for comparing the electrical potential V41 with a reference potential Vref. The reference potential Vref is set to be an intermediate potential between the electrical potential V41 corresponding to the data "0" and the electrical potential V41 corresponding to the data "1". Accordingly, the comparator 61 is capable of detecting whether or not the electrical potential V41 exhibits a value corresponding to the desired data by comparing the electrical potential V41 with the reference potential Vref. In other words, the comparator 61 is capable of determining whether or not the desired data is written into the subject memory cell by comparing the electrical potential V41 with the reference potential Vref.

The comparator 61 outputs a comparison result signal SC which indicates the comparison results to the write control circuit 50. For example, when the electrical potential V41 is smaller than the reference potential Vref, the comparison result signal SC exhibits "low", while the comparison result signal SC exhibits "high" when the electrical potential V41 is larger than the reference potential Vref. The comparison result signal SC is constantly outputted to the write control circuit 50. When the magnetization of the free layer 2 is switched and the resistance value of the magnetoresistance element 1 changes, the level of the comparison result signal SC is instantly switched. That is, it can be said that the comparator 61 carries out the aforementioned determination in real time and supplies the comparison result signal SC indicating the determination results to the write control circuit 50 in real time.

The write control circuit 50 executes processes of the steps S3 and S4 as shown in FIG. 2 in response to the comparison result signal SC sent from the comparator 61 (i.e. determination circuit 60). That is, the write control circuit 50 controls the operation of the write current generating circuit 40 in response to the comparison result signal SC.

From a viewpoint of supplying the write current IW, it can be said that the write current generating circuit 40, the write line decoder 20, and the selection line decoder 30 constitute a "current supply circuit". Meanwhile, from the viewpoint of controlling the write current IW, it can be said that the determination circuit 60 and write control circuit 50 constitutes a "controller". The "current supply circuit" supplies, to the magnetoresistance element 1 of the subject memory cell, the write current IW disposed in a direction corresponding to a data to be written. The "controller" controls the write current IW supplied from the current supply circuit by giving various kinds of instructions to the current supply circuit. Moreover, according to the present embodiment, the controller determines whether or not the desired data is written into the subject memory cell during the write period (in step S2 of FIG. 2).

1-2. Write Control

Next, the write control according to the present embodiment will be explained in detail. The write control which is carried out when the data "1" is recorded in the memory cell 10 storing the data "0" will be explained below as an example. When the data "1" is written into the memory cell 10, a resistance value of the magnetoresistance element 1 increases. Accordingly, the electrical potential V41 of the node 41 also increases.

(Pass Process)

Figure 5:
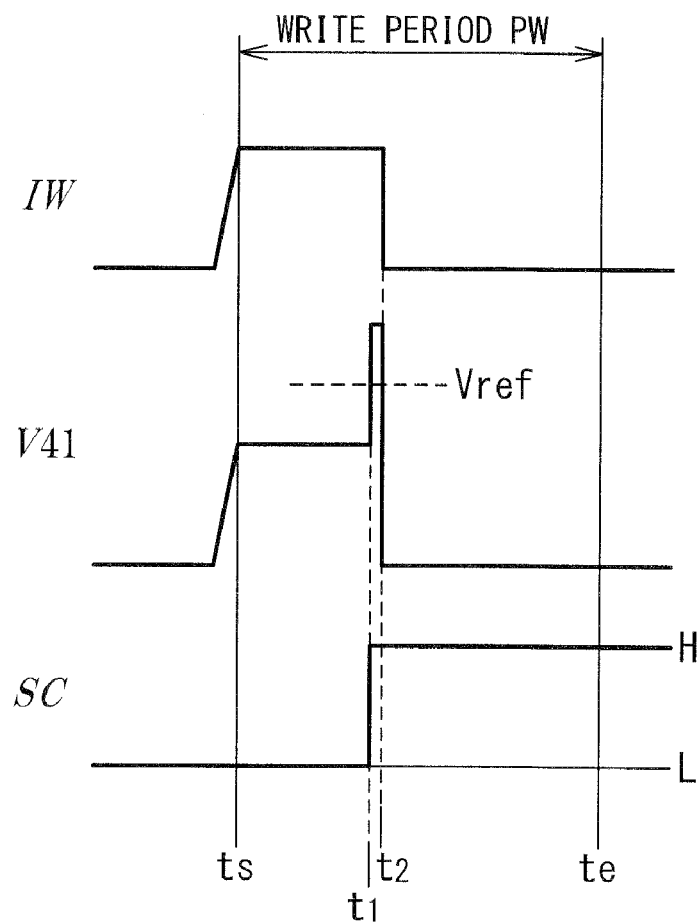
FIG. 5 is a timing chart showing an example of the write control according to the first embodiment.

FIG. 5 shows an example of the write control according to the present embodiment, exhibiting the write current IW, the electrical potential V41 and the comparison result signal SC. A predetermined write period PW is defined to be a period from time ts to time te. During the write period PW, the comparator 61 carries out the aforementioned determination in real time (step S2). In a period from the time ts to time t1, the electrical potential V41 is smaller than the reference potential Vref and the comparison result signal SC exhibits "low". At the time t1 during the write period PW, the magnetization of the free layer 2 is switched and the electrical potential V41 is made larger than the reference potential Vref. As a result, a level of the comparison result signal SC is switched from "low" to "high". The write control circuit 50 instantly outputs instructions to the write current generating circuit 40 so as to finish supplying the write current IW (step S3). It is finished to supply the write current IW at time t2 during the write period PW. Accordingly, reduction of power consumption is achieved.

When the data "1" which is the same as the data "1" stored in the subject memory cell is recorded therein, the comparison result signal SC exhibits "high", i.e. the level corresponding to the desired data to be written, from the beginning. Accordingly, when the write period PW starts, it is instantly discontinued to supply the write current IW. Of course, when a value of a data stored in the subject memory cell is checked beforehand prior to the write operation (i.e. read-ahead process) and the same data is stored, the write operation may not be carried out.

(Failure Process: Extension)

Figure 6:
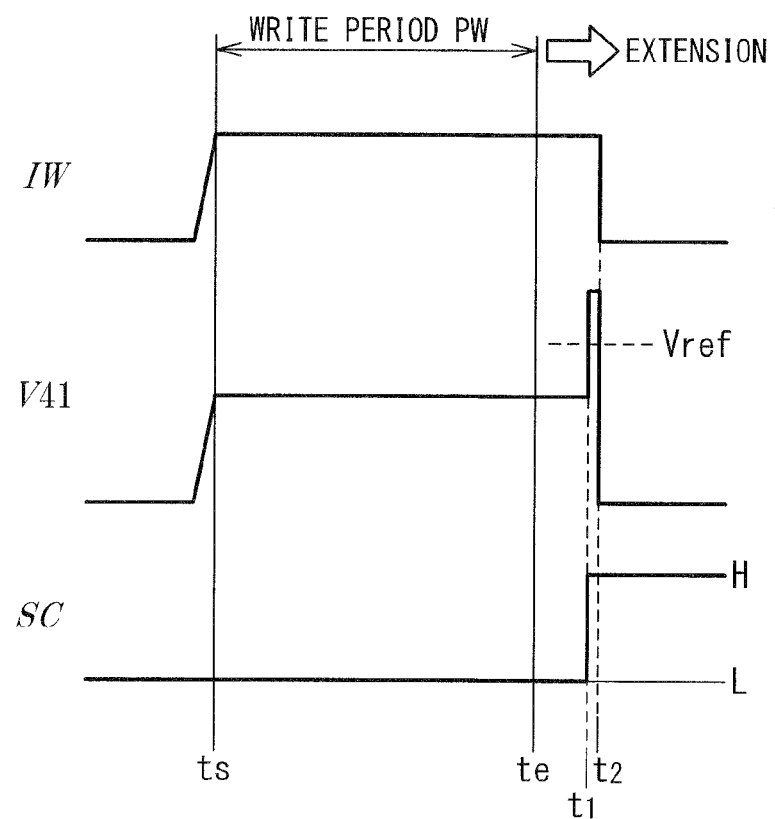
FIG. 6 is a timing chart showing another example of the write control according to the first embodiment.

FIG. 6 shows another example of the write control according to the present embodiment. The comparator 61 carries out the aforementioned determination in real time during the write period PW (step S2). In this example, the magnetization of the free layer 2 is not switched before the predetermined write period PW finishes.

The comparison result signal SC remains "low" across the write period PW and is not brought into a "high" level corresponding to the desired data even at the time te. In this case, the write control circuit 50 outputs instructions to the write current generating circuit 40 so as to extend the write period PW (step S4). Therefore, an increase in a transfer amount (or shift amount) of spin electrons is expected, where magnetization switching of the free layer 2 is expected.

At time t1 which is after the time te, the magnetization of the free layer 2 is switched and the electrical potential V41 is made larger than the reference potential Vref. As a result, a level of the comparison result signal SC is switched from "low" to "high". The write control circuit 50 instantly outputs instructions to the write current generating circuit 40 so as to finish supplying the write current IW. At time t2, it is discontinued to supply the write current IW. It should be noted that a write error is rarely observed and thereby such a failure process is carried out on rare occasions.

(Failure Process: Rewrite)

Figure 7:
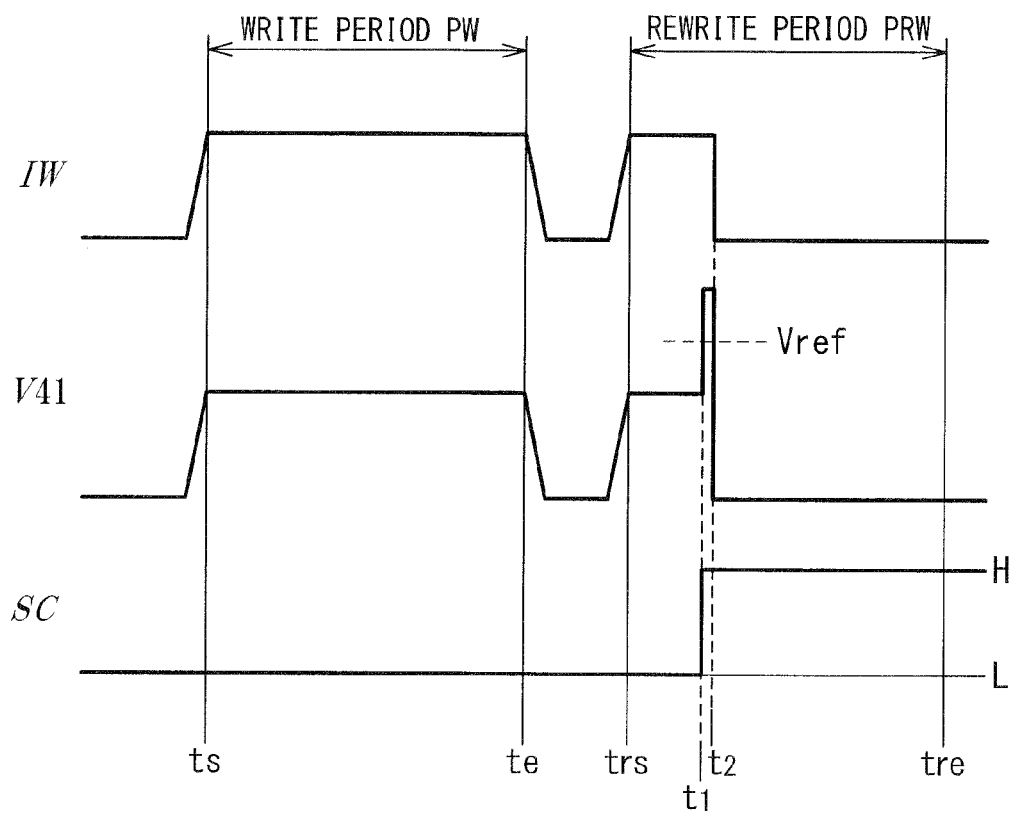
FIG. 7 is a timing chart showing another example of the write control according to the first embodiment.

FIG. 7 shows another example of the write control according to the present embodiment. During the write period PW, the comparator 61 carries out the aforementioned determination in real time (step S2). In this example, the magnetization of the free layer 2 is not switched before the predetermined write period PW finishes.

The comparison result signal SC remains "low" across the write period PW and is not brought into a "high" level corresponding to the desired data even at the time te. In this case, the write control circuit 50 executes a write control again after finishing a write control normally (step S4).

A rewrite period PRW is defined to be a period from time trs to time tre. The write control circuit 50 outputs instructions to the write current generating circuit 40 so as to supply the rewrite current IW in the rewrite period PRW. Therefore, an increase in a transfer amount (or shift amount) of spin electrons is expected, where the magnetization switching of the free layer 2 is expected. In a period from the time trs to time t1, the electrical potential V41 is smaller than the reference potential Vref and the comparison result signal SC remains "low". The magnetization of the free layer 2 is switched at the time t1 during the rewrite period PRW, where the electrical potential V41 is made larger than the reference potential Vref. As a result, a level of the comparison result signal SC is switched from "low" to "high". The write control circuit 50 instantly outputs instructions to the write current generating circuit 40 so as to finish supplying the rewrite current IW. It is discontinued to supply the rewrite current IW at time t2.

Such the rewrite process may be repeated for a predetermined number of times. When the data is not written into the subject memory cell by the rewrite process which is repeated for the predetermined number of times, the subject memory cell is registered in a storage region as a failure cell (or failure bit). Thereafter, an alternative cell which is made to correspond to the failure cell is used in place of the failure cell. It should be noted that a write error is rarely observed and thereby such a failure process is carried out on rare occasions.

1-3. Effects

As explained above, the MRAM according to the present embodiment makes it possible to determine whether or not a data is written into a subject memory cell during a write period PW in real time. When the desired data is written, it is finished during the write period PW to supply a write current IW.

Accordingly, reduction of power consumption is achieved. Meanwhile, when the data is not written before the predetermined write period PW finishes, an extension process or a rewrite process is executed. Therefore, a probability of writing the desired data into the subject memory cell increases and a probability of erroneous writing decreases. Therefore, reliability of the MRAM is enhanced.

According to the present embodiment, it is also made possible to prevent reduction of an operation speed. The reason is as follows. Since erroneous writing (or write errors) is observed on rare occasions, verification conducted every time each write control finishes causes reduction of an operation speed. However, according to the present embodiment, data is verified during each write control. In most cases, the extension process and the rewrite process are not executed, which suppresses an increase in an amount of time to write data.

Accordingly, the reduction of the operation speed can be prevented. That is, according to the present invention, a probability of erroneous writing is reduced and a high-speed operation is maintained. Such a control can be realized owing to the MRAM.

Furthermore, the reduced probability of erroneous writing allows an ECC (error correction code) circuit to exclusively deal with data destruction caused by thermal disturbance. Therefore, it is possible to prevent the ECC circuit from being enlarged in terms of the size.

Accordingly, reduction in a circuit area is achieved according to the present invention.

2. SECOND EMBODIMENT 2-1. Circuit configuration

Figure 8:
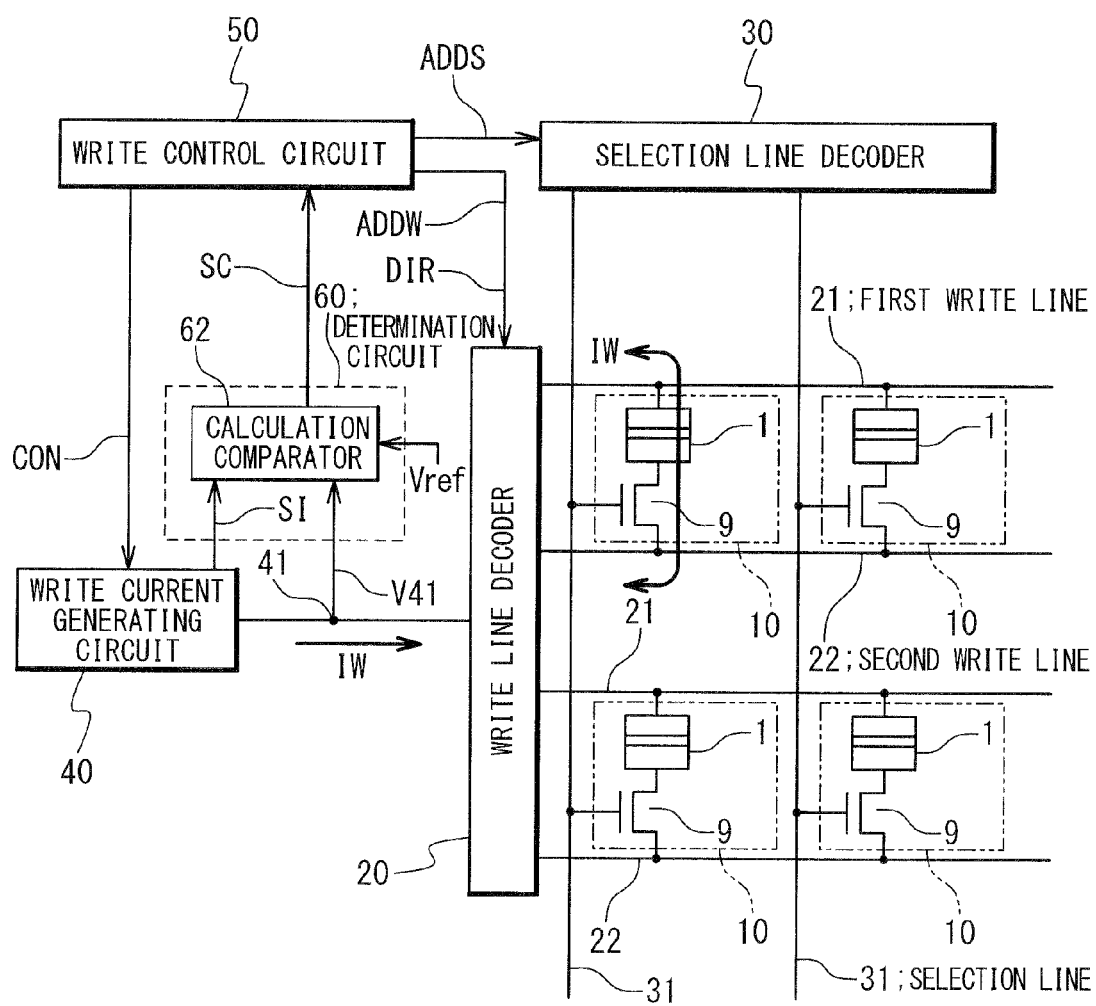
FIG. 8 is a circuit block diagram showing a configuration of the MRAM of a second embodiment according to the present invention.

FIG. 8 is a circuit block diagram showing a configuration of the MRAM of a second embodiment according to the present invention. In FIG. 8, the same reference letters as those of FIG. 3 refer to the same elements as those of FIG. 3, and explanation thereof will be appropriately omitted. In the present embodiment, the determination circuit 60 includes a calculation comparator 62. The electrical potential V41 and a current signal SI indicating a value of the write current IW are inputted to the calculation comparator 62. The calculation comparator 62 then calculates a "ratio" between the electrical potential V41 and the write current IW, and compares the "ratio" with a predetermined reference value. The "ratio" exhibits a value obtained by dividing the electrical current V41 by the write current IW, or a value obtained by dividing the write current IW by the electrical potential V41.

The reason why the calculation comparator 62 calculates the ratio between the electrical potential V41 and the write current IW is as follows. When the write current IW changes, the electrical potential V41 changes even if a resistance value of the magnetoresistance element 1 remains unchanged. In this case, it is impossible to simply compare the electrical potential V41 with the predetermined the reference potential Vref in order to determine whether a data is written. Although the reference potential Vref which changes on the basis of a fluctuation of the write current IW may be prepared, the ratio between the electrical potential V41 and the write current IW is calculated according to the present embodiment. The ratio is not influenced by a fluctuation of the write current IW, which makes it possible to detect variations of the resistance value of the magnetoresistance element 1 by using the predetermined reference value. In other words, it is made possible to easily detect variations of the resistance value even if the write current IW changes, by normalizing the electrical potential V41 using the write current IW.

As an example, a value obtained by dividing the electrical potential V41 by the write current IW is used for the ratio. In this case, a ratio (V41/IW) increases in accordance with an increase of the resistance value of the magnetoresistance element 1, and the ratio (V41/IW) decreases in accordance with the decrease of the resistance value. The reference value Vref is set to be an intermediate value between a ratio corresponding to the data "0" and a ratio corresponding to the data "1". The calculation comparator 62 compares the ratio (V41/IW) with the reference value Vref, so that it can be determined whether or not the desired data is written into the subject memory cell. The calculation comparator 62 outputs the comparison result signal SC indicating the comparison results to the write control circuit 50. The comparison result signal SC is constantly outputted to the write control circuit 50. That is, it can be said that the calculation comparator 62 carries out the aforementioned determination in real time and supplies the comparison result signal SC indicating the determination results to the write control circuit 50 in real time.

2-2. Write Control

In the spin transfer method, there is a report that one of factors by which a write threshold value is influenced is a "current density". Accordingly, it is also possible to increase the write current IW gradually or stepwise until the magnetization of the free layer 2 is switched. According to the present embodiment, the write current IW increases in terms of time. Even if the write current IW fluctuates, the calculation comparator 62 calculates the aforementioned ratio so that the ratio and the predetermined reference value Vref can be simply compared.

(Pass Process)

Figure 9:
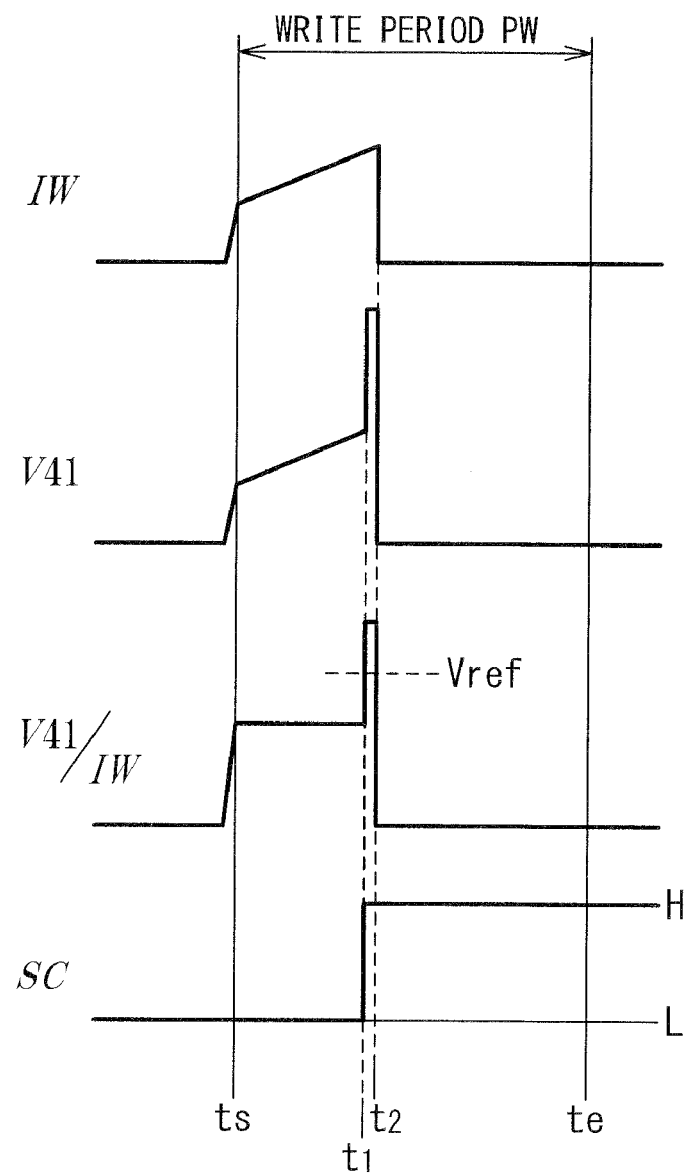
FIG. 9 is a timing chart showing an example of the write control according to the second embodiment.

FIG. 9 shows an example of the write control according to the present embodiment, exhibiting the write current IW, the electrical potential V41, the ratio (V41/IW), and the comparison result signal SC. The predetermined write period PW is defined to be a period from time ts to time te. In FIG. 9, the write current IW increases in terms of time during the write period PW. Accordingly, the electrical potential V41 also increases in terms of time. The ratio (V41/IW) is maintained in a fixed value unless the resistance value of the magnetoresistance element 1 changes.

The calculation comparator 62 carries out the aforementioned determination in real time during the write period PW (step S2). The ratio (V41/IW) is smaller than the reference value Vref in a period from the time ts to time t1, and the comparison result signal SC remains "low". At the time t1 during the write period PW, the magnetization of the free layer 2 is switched, where the ratio (V41/IW) is made larger than the reference value Vref. As a result, the level of the comparison result signal SC is switched from "low" to "high". The write control circuit 50 instantly outputs instructions to the write current generating circuit 40 so as to finish supplying the write current IW (step S3). It is finished to supply the write current IW at time t2 during the write period PW. Accordingly, reduction of power consumption is achieved.

(Failure Process: Extension)

Figure 10:
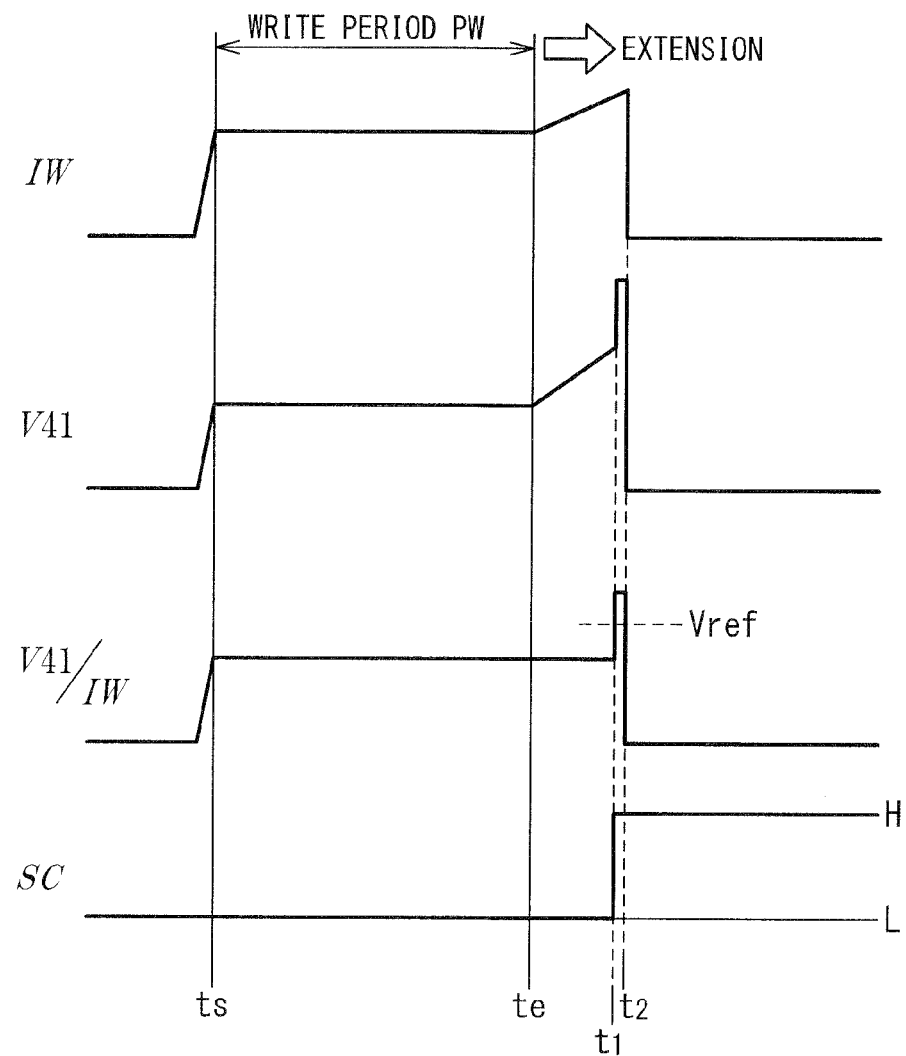
FIG. 10 is a timing chart showing another example of the write control according to the second embodiment.

FIG. 10 shows another example of the write control according to the present embodiment. During the predetermined write period PW, the write current IW is set to have a predetermined value. In this example, the magnetization of the free layer 2 is not switched before the predetermined write period PW finishes. The comparison result signal SC remains "low" across the write period PW, and is not brought into a "high" level corresponding to the desired data even at the time te. In this case, the write control circuit 50 outputs instructions to the write current generating circuit 40 so as to extend the write period PW (step S4). The write control circuit 50 here outputs instructions to the write current generating circuit 40 so as to increase the write current IW in an extended period. Therefore, it is expected that the magnetization of the free layer 2 is easily switched. It should be noted that a write error is rarely observed, and thereby such a fail process is executed on rare occasions.

The write current IW increases in terms of time from the time te. Accordingly, the electrical potential V41 also increases in terms of time. The ratio (V41/IW) is maintained to have the level which is the same as the level obtained prior to the time te unless the resistance value of the magnetoresistance element 1 changes. At time t1, the magnetization of the free layer 2 is switched, where the ratio (V/41/IW) is made larger than the reference value Vref. As a result, the level of the comparison result signal SC is switched from "low" to "high". The write control circuit 50 instantly outputs instructions to the write current generating circuit 40 so as to finish supplying the write current IW.

At time t2, it is discontinued to supply the write current IW. According to this example, the write current IW thus increases in terms of time during the extended period until the magnetization of the free layer 2 is switched.

Figure 11:
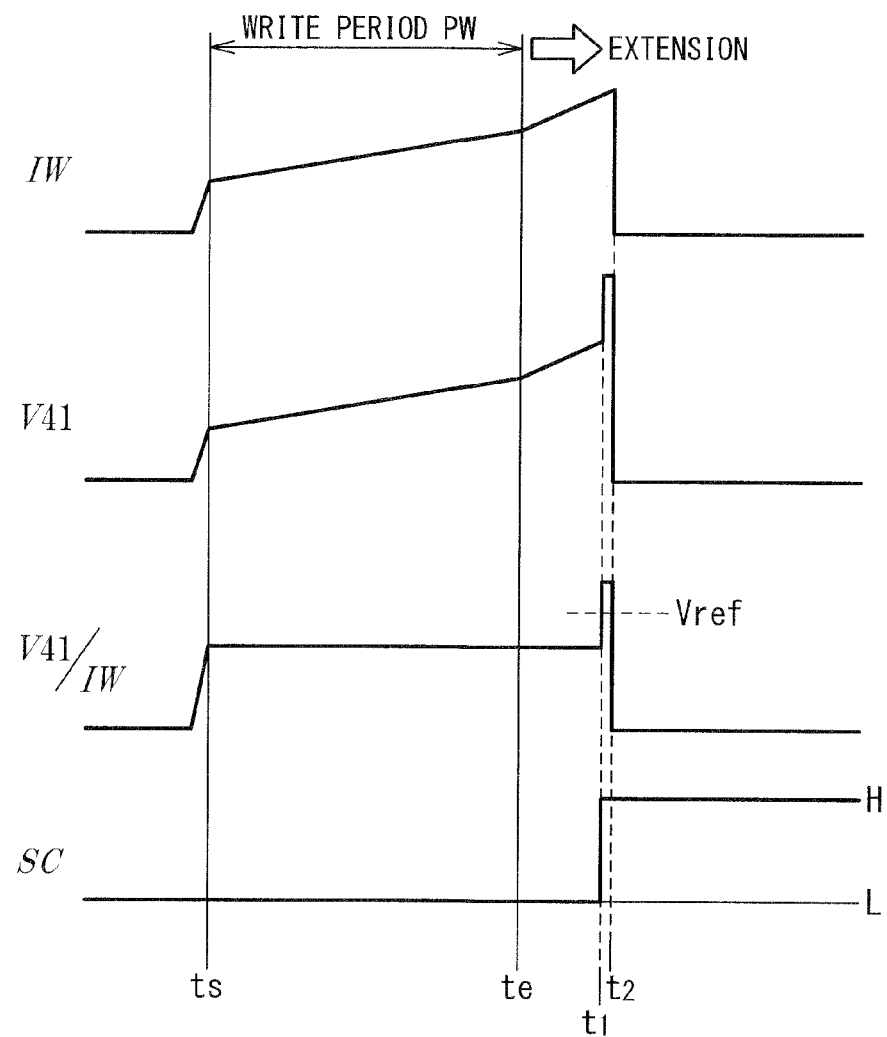
FIG. 11 is a timing chart showing another example of the write control according to the second embodiment.

FIG. 11 shows another example. In this example, the write current IW increases even in the predetermined write period PW. The write control circuit 50 then outputs instructions to the write current generating circuit 40 so as to extend the write period PW because the magnetization of the free layer 2 is not switched before the predetermined write period PW finishes (step S4). The write current IW increases even in an extended period. An increase rate of the write current IW during the extended period may be set to be larger than an increase rate thereof during the predetermined write period PW. At time t1, the magnetization of the free layer 2 is switched, where the level of the comparison result signal SC is switched from "low" to "high". At time t2, it is discontinued to supply the write current IW. According to this example, the write current IW thus increases in terms of time until the magnetization of the free layer 2 is switched.

(Failure Process: Rewrite)

Figure 12:
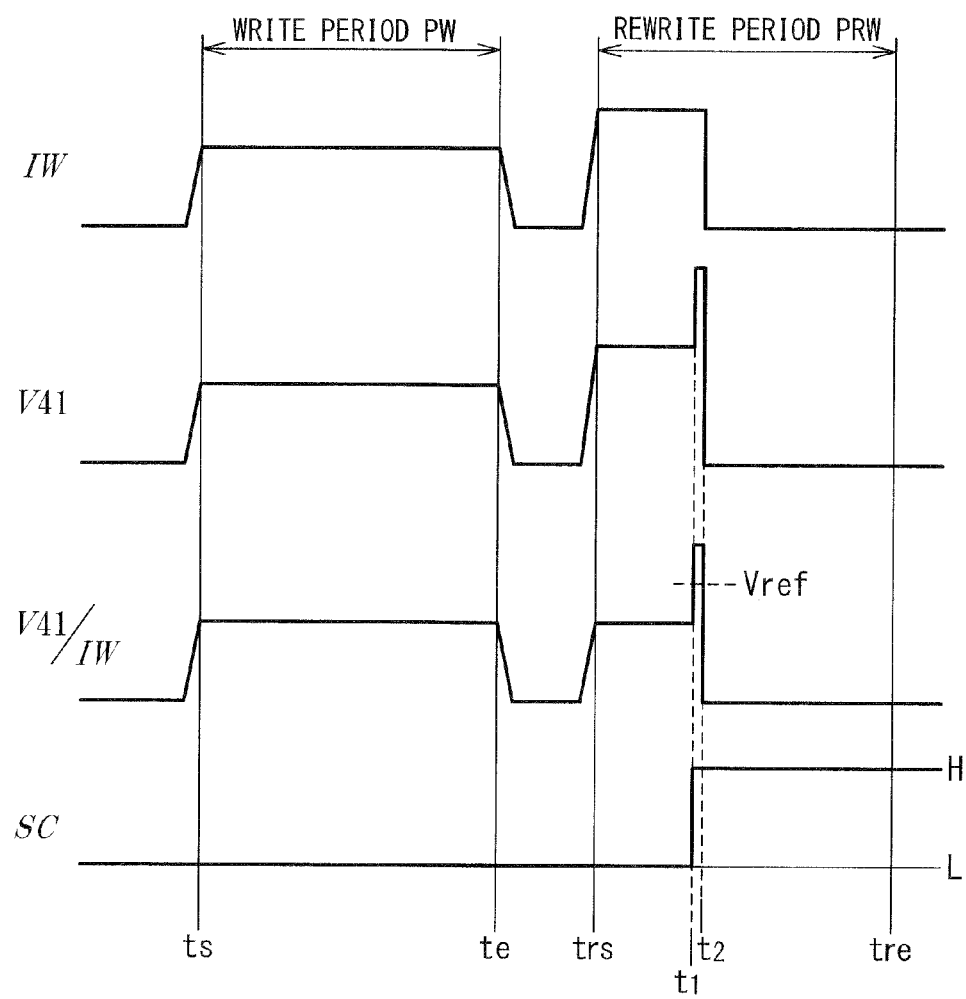
FIG. 12 is a timing chart showing another example of the write control according to the second embodiment.

FIG. 12 shows another example of the write control according to the present embodiment. The write current IW is set to have a predetermined value during the predetermined write period PW. In this example, the magnetization of the free layer 2 is not switched before the predetermined write period PW finishes. The comparison result signal SC remains "low" across the write period PW, and is not brought into a "high" level corresponding to the desired data even at the time te. In this case, the write control circuit 50 executes the write control again after finishing the write control normally (step S4).

The rewrite period PRW is defined to be a period from time trs to time tre. The write control circuit 50 outputs instructions to the write current generating circuit 40 so as to supply the rewrite current IW during the rewrite period PRW. The write control circuit 50 here outputs instructions to the write current generating circuit 40 so that the rewrite current IW is made larger than the write current IW during the write period PW. Therefore, it is expected that the magnetization of the free layer 2 is easily switched.

In a period from the time trs to time t1, the ratio (V41/IW) is maintained to have a level which is the same as the level obtained before the time te. The magnetization of the free layer 2 is switched at the time t1 during the rewrite period PRW, where the ratio (V41/IW) is made larger than the reference value Vref. As a result, the level of the comparison result signal SC is switched from "low" to "high". The write control circuit 50 instantly outputs instructions to the write current generating circuit 40 so as to finish supplying the rewrite current IW. At time t2, it is discontinued to supply the rewrite current IW.

Figure 13:
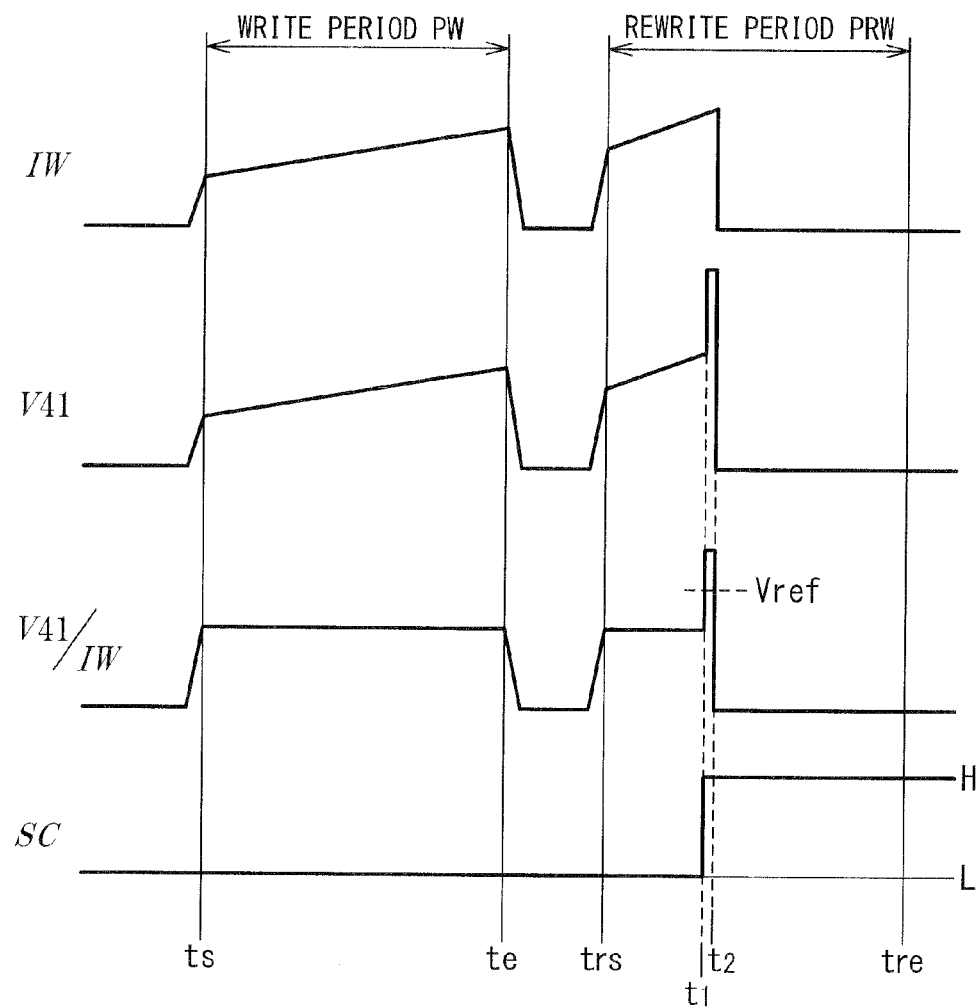
FIG. 13 is a timing chart showing another example of the write control according to the second embodiment.

FIG. 13 shows another example. In this example, the write current IW increases during the predetermined write period PW. The write control circuit 50 then executes a rewrite control since the magnetization of the free layer 2 is not switched before the predetermined write period PW finishes (step S4). An initial value of the rewrite current IW is preferably set to be larger than an initial value of the write current IW. The rewrite current IW also increases in the rewrite period PRW. An increase rate of the rewrite current IW may also be set to be larger than an increase rate of the write current IW. At time t1, the magnetization of the free layer 2 is switched and the level of the comparison result signal SC is switched from "low" to "high". At time t2, it is discontinued to supply the rewrite current IW.

Such the rewrite process may be repeated for a predetermined number of times. If the data is not written into the subject memory cell by the rewrite process which is repeated for the predetermined number of times, the subject memory cell is registered in a storage region as a failure cell (or failure bit). Thereafter, an alternative cell which is made to correspond to the failure cell is used in place of the failure cell.

2-3. Effects

According to the present embodiment, effects similar to those of the first embodiment can be obtained. Furthermore, since the write circuit IW is controlled to increase, a probability of writing the desired data into the subject memory cell is further increased, while a probability of erroneous writing is further decreased. Accordingly, reliability of the MRAM is further enhanced. In asteroid methods, it is difficult to increase the write current when the desired data is not written into the subject memory cell. It is because memory cells other than the subject memory cell are influenced by the write current. In contrast, in the spin transfer method, the write current IW which passes through the magnetoresistance elements 1 acts only on the subject memory cell, which means that an increase in the write current IW does not have an influence on other memory cells. The write control according to the present embodiment can be said to be realized by the spin transfer method.

3. THIRD EMBODIMENT

3-1. Circuit Configuration

Figure 14:
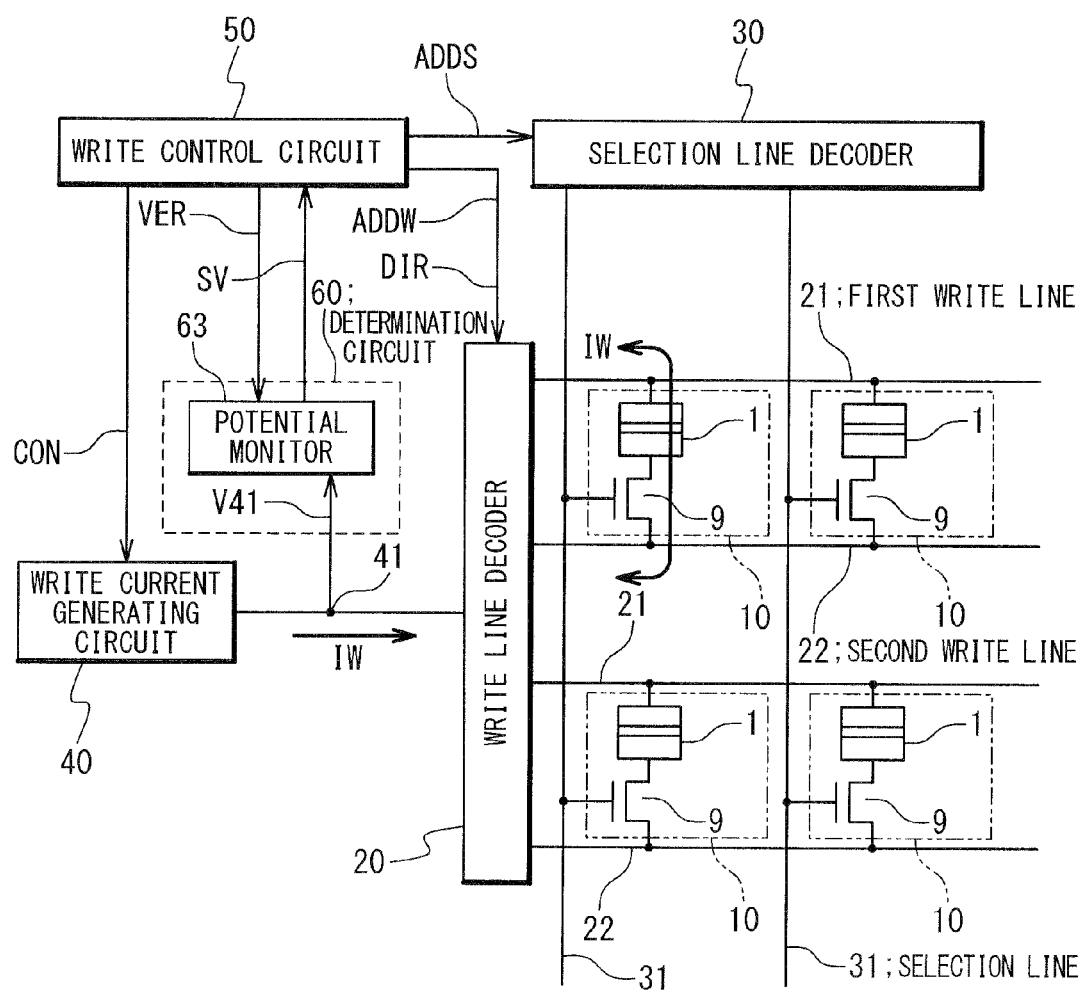
FIG. 14 is a circuit block diagram showing a configuration of the MRAM of a third embodiment according to the present invention.

FIG. 14 is a circuit block diagram showing a configuration of the MRAM of a third embodiment according to the present invention. In FIG. 14, the same reference letters as those of FIG. 3 refer to the same elements as those of FIG. 3, and explanation thereof will be appropriately omitted. In the present embodiment, the determination circuit 60 includes a potential monitor 63 for monitoring the electrical potential V41 of the node 41.

The determination circuit 60 may not necessarily carry out the aforementioned determination in real time. The write control circuit 50 outputs a verifying instruction signal VER to the potential monitor 63 at a predetermined timing during the write period PW. The potential monitor 63 determines whether or not desired data is written at the predetermined timing on the basis of the electrical potential V41 (or information on the electrical potential V41). The potential monitor 63 then outputs a verifying result signal SV indicating the determination result to the write control circuit 50. The write control circuit 50 executes processes of the steps S3 and S4 as shown in FIG. 2 in response to the verifying result signal SV sent from the potential monitor 63 (or determination circuit 60). That is, the write control circuit 50 controls an operation of the write current generating circuit 40 in response to the verifying result signal SV.

3-2. Write Control (Pass Process)

Figure 15:
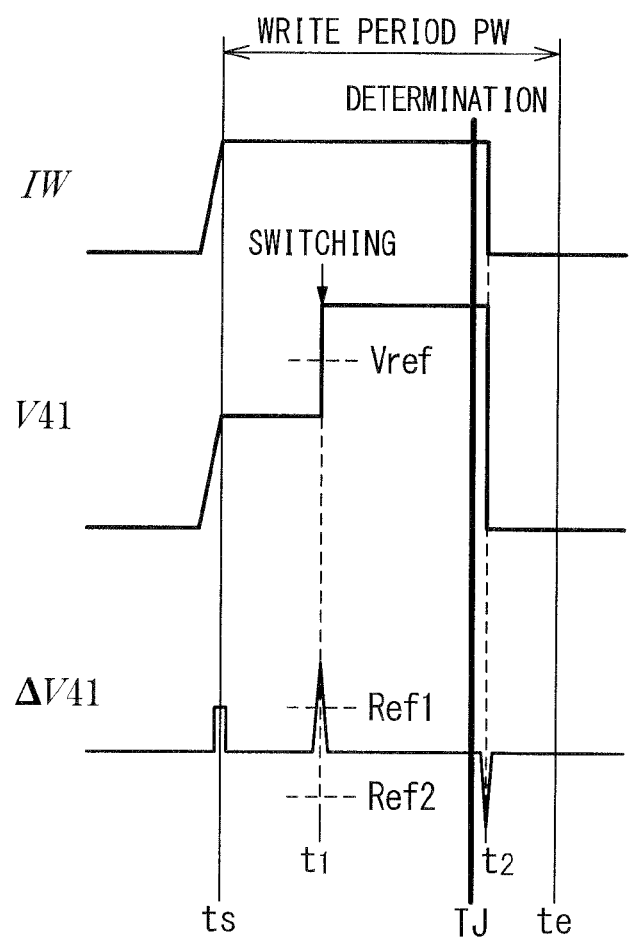
FIG. 15 is a timing chart showing an example of the write control according to the third embodiment.

FIG. 15 shows an example of the write control according to the present embodiment, exhibiting the write current IW, the electrical potential V41, and a time differential value $\Delta V41$ of the electrical potential V41. The predetermined write period PW is defined to be a period from time ts to time te. It is also assumed that the aforementioned determination is carried out at a predetermined timing TJ during the write period PW.

In the example shown in FIG. 15, the magnetization of the free layer 2 is switched at timing t1 which is prior to the timing TJ, so that the electrical potential V41 is made larger than the reference potential Vref as a result. Thereafter, the aforementioned determination is carried out in response to instructions from the write control circuit 50 at the predetermined timing TJ. At the timing TJ, the electrical potential V41 is already larger than the reference potential Vref, i.e. exhibits the value corresponding to the desired data. Accordingly, the potential monitor 63 outputs the verifying result signal SV indicating "pass" to the write control circuit 50. The write control circuit 50 instantly outputs instructions to the write current generating circuit 40 so as to finish supplying the write current IW (step S3). It is discontinued to supply the write current IW at time t2 during the write period PW. Accordingly, reduction of power consumption is achieved.

In the determination, the time differential value $\Delta V41$ of the electrical potential V41 may also be used in place of the electrical potential V41. In this case, the determination circuit 60 is further provided with a differential circuit (not shown) which performs a differential operation of the electrical potential V41. In the example shown in FIG. 15, the electrical potential V41 changes in accordance with magnetization switching at time t1, where pulse-like variations (switching pulse) appear in the time differential value $\Delta V41$. The time differential value $\Delta V41$ is compared with a predetermined reference value Ref1, which makes it possible to detect a switching pulse reaching the reference value Ref 1 (a reference value Ref2 is used in a case of writing the data "0"). The determination circuit 60 stores that a switching pulse was detected, and performs the aforementioned determination at the determination timing TJ on the basis of a presence or absence of the switching pulse. The time differential value $\Delta V41$ may also be used in the first embodiment already presented.

(Failure Process: Extension)

Figure 16:
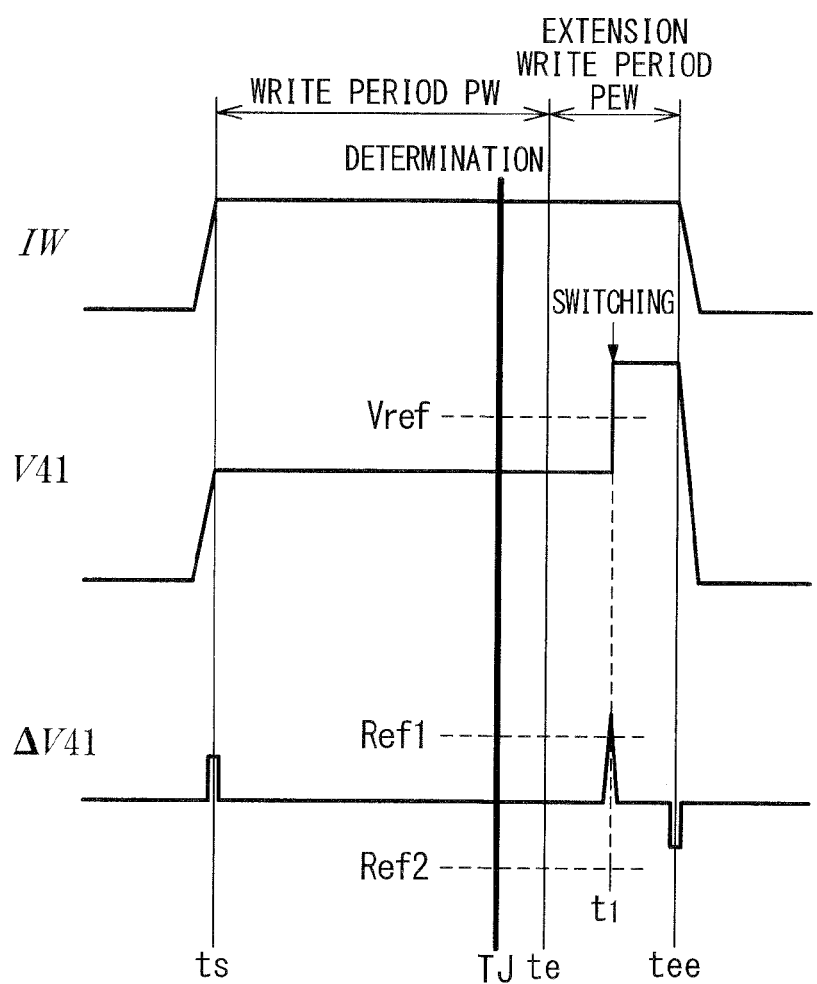
FIG. 16 is a timing chart showing another example of the write control according to the third embodiment.

FIG. 16 shows another example of the write control according to the present embodiment. It is assumed that the aforementioned determination is carried out at the predetermined timing TJ during the write period PW. In this example, the magnetization of the free layer 2 is not switched yet at the predetermined timing TJ. That is, the electrical potential V41 does not exhibit a value corresponding to the desired data at the timing TJ. Accordingly, the potential monitor 63 outputs the verifying result signal SV indicating "failure" to the write control circuit 50. In this case, the write control circuit 50 outputs instructions to the write current generating circuit 40 so as to extend the write period PW (step S4). Therefore, an increase in a transfer amount (shift amount) of spin electrons is expected, where the magnetization switching of the free layer 2 is expected.

An extended write period PEW is defined to be a period from the time te to time tee. The extended write period PEW is set to have, for example, one clock cycle. At time t1 of the extended write period PEW, the magnetization of the free layer 2 is switched, where the electrical potential V41 is made larger than the reference potential Vref. When the extended write period PEW finishes, it is also finished to supply the write current IW. The time differential value $\Delta V41$ of the electrical potential V41 may also be used in the determination.

(Failure Process: Rewrite)

Figure 17:
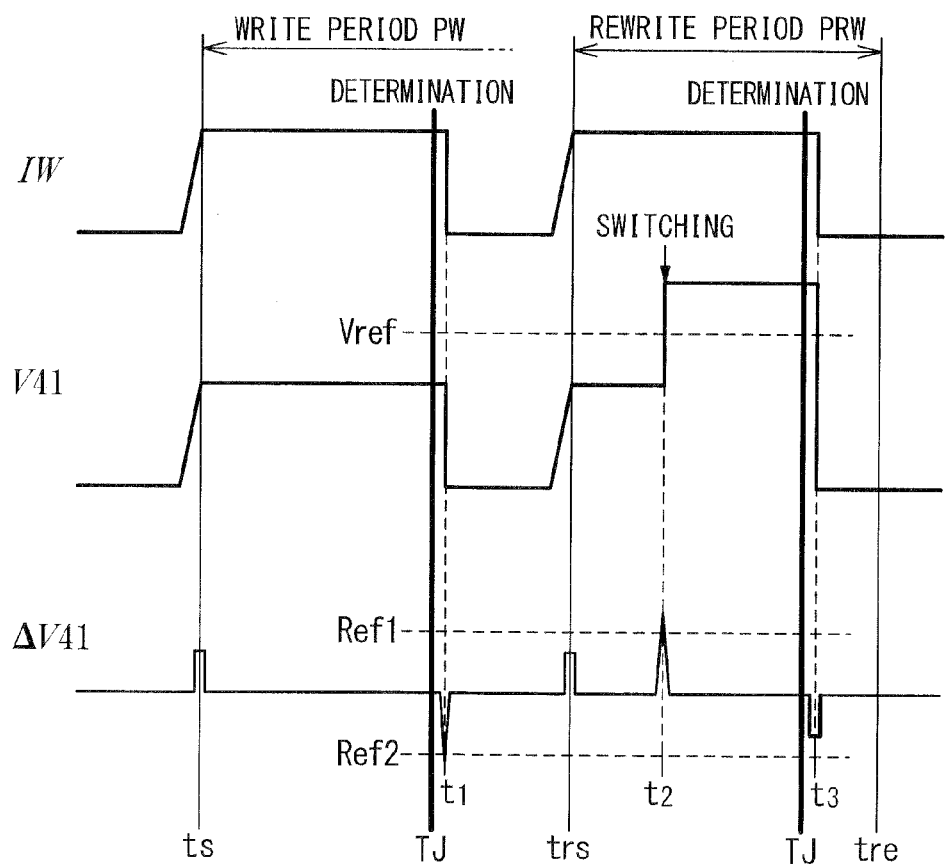
FIG. 17 is a timing chart showing another example of the write control according to the third embodiment.

FIG. 17 shows another example of the write control according to the present embodiment. It is assumed that the aforementioned determination is carried out at the predetermined timing TJ during the write period PW. In this example, the magnetization of the free layer 2 is not switched yet at the predetermined timing TJ. That is, the electrical potential V41 does not exhibit a value corresponding to the desired data at the timing TJ. Accordingly, the potential monitor 63 outputs the verifying result signal SV indicating "failure" to the write control circuit 50. In this case, the write control circuit 50 outputs instructions to the write current generating circuit 40 so as to discontinue supplying the write current IW. At time t1, supplying the write current IW is forcibly finished. Following next is a rewrite control which is executed by the write control circuit 50 (step S4).

The rewrite period PRW is defined to be a period from time trs to time tre. The write control circuit 50 outputs instructions to the write current generating circuit 40 so as to supply the rewrite current IW during the rewrite period PRW. Therefore, an increase in a transfer amount (or shift amount) of spin electrons is expected, where the magnetization switching of the free layer 2 is expected. At time t2 of the rewrite period PRW, the magnetization of the free layer 2 is switched and the electrical potential V41 is made larger than the reference potential Vref. Thereafter, at the predetermined timing TJ during the rewrite period PRW, the aforementioned determination is carried out again. In this case, the electrical potential V41 already exhibits the value corresponding to the desired data. Accordingly, the potential monitor 63 outputs the verifying result signal SV indicating "pass" to the write control circuit 50. The write control circuit 50 instantly outputs instructions to the write current generating circuit 40 so as to finish supplying the rewrite current IW. At time t3, it is finished to supply the rewrite current IW. The time differential value ΔV41 of the electrical potential V41 may also be used in the determination.

Such the rewrite process may also be repeated for a predetermined number of times. If data is not written into the subject memory cell by the rewrite process which is repeated for the predetermined number of times, the subject memory cell is registered in the storage region as a failure cell (or failure bit). Thereafter, an alternative cell which is made to correspond to the failure cell is used in place of the failure cell.

3-3. Effects

According to the present embodiment, effects similar to those of the first embodiment can be obtained.

4. FOURTH EMBODIMENT

4-1. Circuit Configuration

Figure 18:
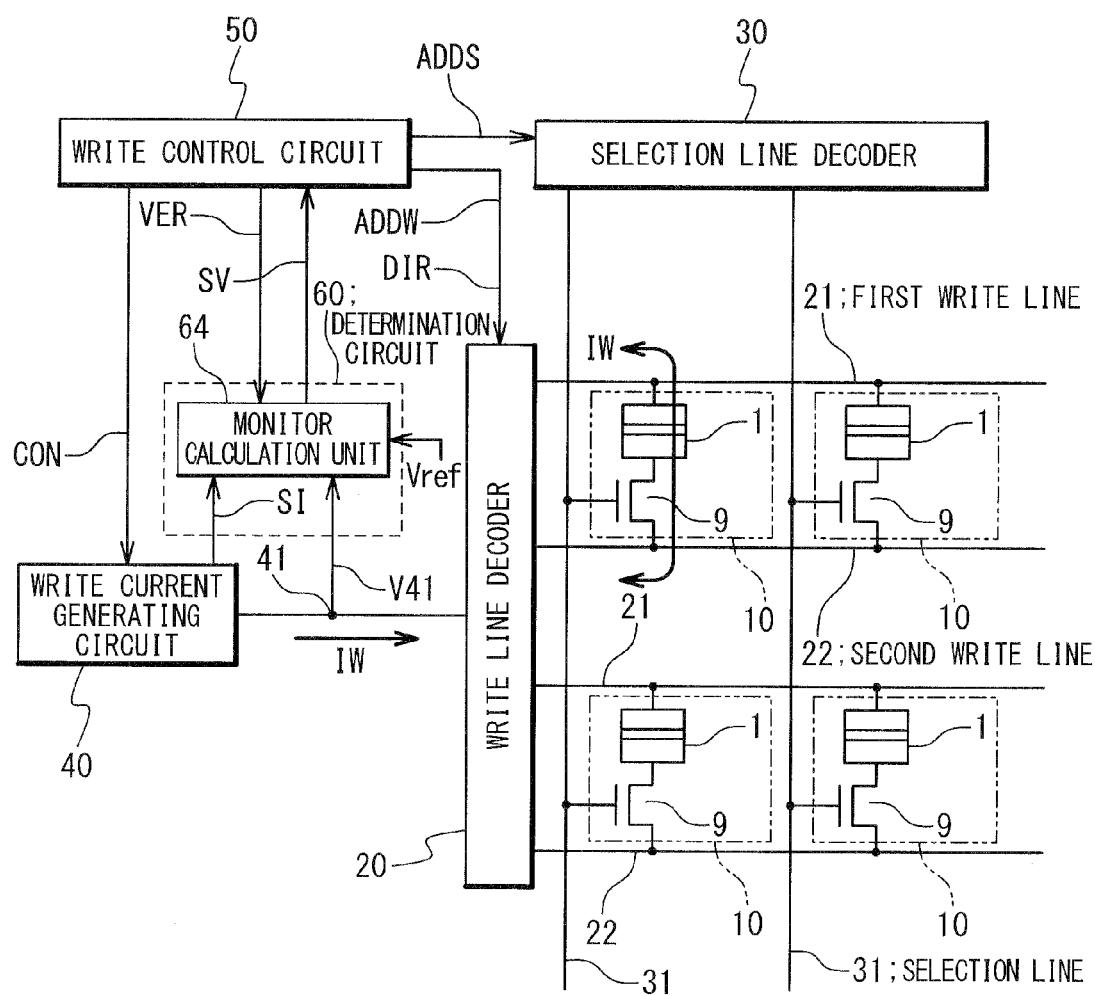
FIG. 18 is a circuit block diagram showing a configuration of the MRAM of a fourth embodiment according to the present invention.

FIG. 18 is a circuit block diagram showing a configuration of the MRAM of a fourth embodiment according to the present invention. In FIG. 18, the same reference letters as those of FIG. 3 refer to the same elements as those of FIG. 3, and explanation thereof will be appropriately omitted. In the present embodiment, the determination circuit 60 includes a monitor calculation unit 64. The electrical potential V41 and a current signal SI which indicates a value of the write current IW are inputted to the monitor calculation unit 64. The monitor calculation unit 64 then calculates a "ratio" between the electrical potential V41 and the write current IW. The "ratio" is a value obtained by dividing the electrical potential V41 by the write current IW, or a value obtained by dividing the write current IW by the electrical potential V41.

The write control circuit 50 outputs the verifying instruction signal VER to the monitor calculation unit 64 at the predetermined timing during the write period PW. The monitor calculation unit 64 determines whether or not the desired data is written at the predetermined timing on the basis of the calculated "ratio" (or information on the "ratio"). The monitor calculation unit 64 then outputs the verifying result signal SV indicating the determination results to the write control circuit 50. The write control circuit 50 executes processes of the steps S3 and S4 as shown in FIG. 2 in response to the verifying result signal SV from the monitor calculation unit 64 (i.e. determination circuit 60). That is, the write control circuit 50 controls an operation of the write current generating circuit 40 in response to the verifying result signal SV.

4-2. Write Control

According to the present embodiment, the write current IW increases in terms of time. Even if the write current IW changes, the monitor calculation unit 64 calculates the aforementioned ratio, which makes it possible to easily compare the ratio with the predetermined reference value Vref. As an example, the value obtained by dividing the electrical potential V41 by the write current IW is used for the ratio. The reference value Vref is set to be an intermediate value between a ratio corresponding to the data "0" and a ratio corresponding to the data "1".

(Pass Process)

Figure 19:
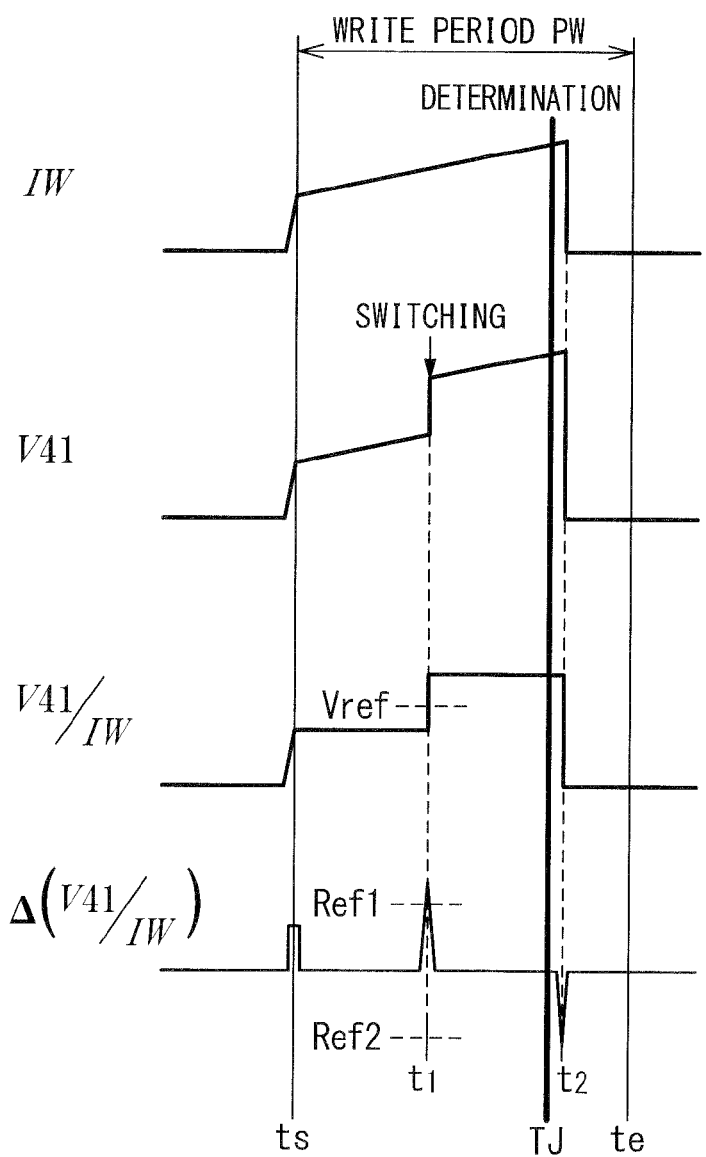
FIG. 19 is a timing chart showing an example of the write control according to the fourth embodiment.

FIG. 19 shows an example of the write control according to the present embodiment, exhibiting the write current IW, the electrical potential V41, the ratio (V41/IW), and the time differential value Δ (V41/IW) of the ratio. The predetermined write period PW is defined to be a period from time ts to time te. It is also assumed that the aforementioned determination is carried out at the predetermined timing TJ during the write period PW. In FIG. 19, the write current IW increases in terms of time during the write period PW. Accordingly, the electrical potential V41 also increases in terms of time. The ratio (V41/IW) is maintained to have a fixed value unless a resistance value of the magnetoresistance element 1 changes.

In the example shown in FIG. 19, the magnetization of the free layer 2 is switched at timing t1 which is prior to the timing TJ, where the ratio (V41/IW) is made larger than the reference value Vref as a result. Thereafter, the aforementioned determination is carried out at the predetermined timing TJ in response to instructions from the write control circuit 50. At the timing TJ, the ratio (V41/IW) is already larger than the reference value Vref, i.e. exhibits a value corresponding to the desired data. Accordingly, the monitor calculation unit 64 outputs the verifying result signal SV indicating "pass" to the write control circuit 50. The write control circuit 50 instantly outputs instructions to the write current generating circuit 40 so as to finish supplying the write current IW (step S3). It is finished to supply the write current IW at time t2 during the write period PW. Accordingly, reduction of power consumption is achieved.

In the determination, the ratio (V41/IW) may be replaced with a time differential value Δ (V41/IW) of the ratio. In this case, the determination circuit 60 further includes a differential circuit (not shown) for performing a differential operation of the ratio (V41/IW). In the example shown in FIG. 19, the ratio (V41/IW) changes in accordance with the magnetization switching at the time t1, where pulse-like variations (or switching pulse) appear in the time differential value Δ (V41/IW). The time differential value Δ (V41/IW) is compared with the predetermined reference value Ref1, which makes it possible to detect a switching pulse reaching the reference value Ref1 (reference value Ref2 is used in the case of writing the data "0"). The determination circuit 60 stores that a switching pulse is detected, carrying out the aforementioned determination at the determination timing TJ on the basis of a presence or absence of the switching pulse. The time differential value Δ (V41/IW) may also be used in the second embodiment already presented.

(Failure Process: Extension)

Figure 20:
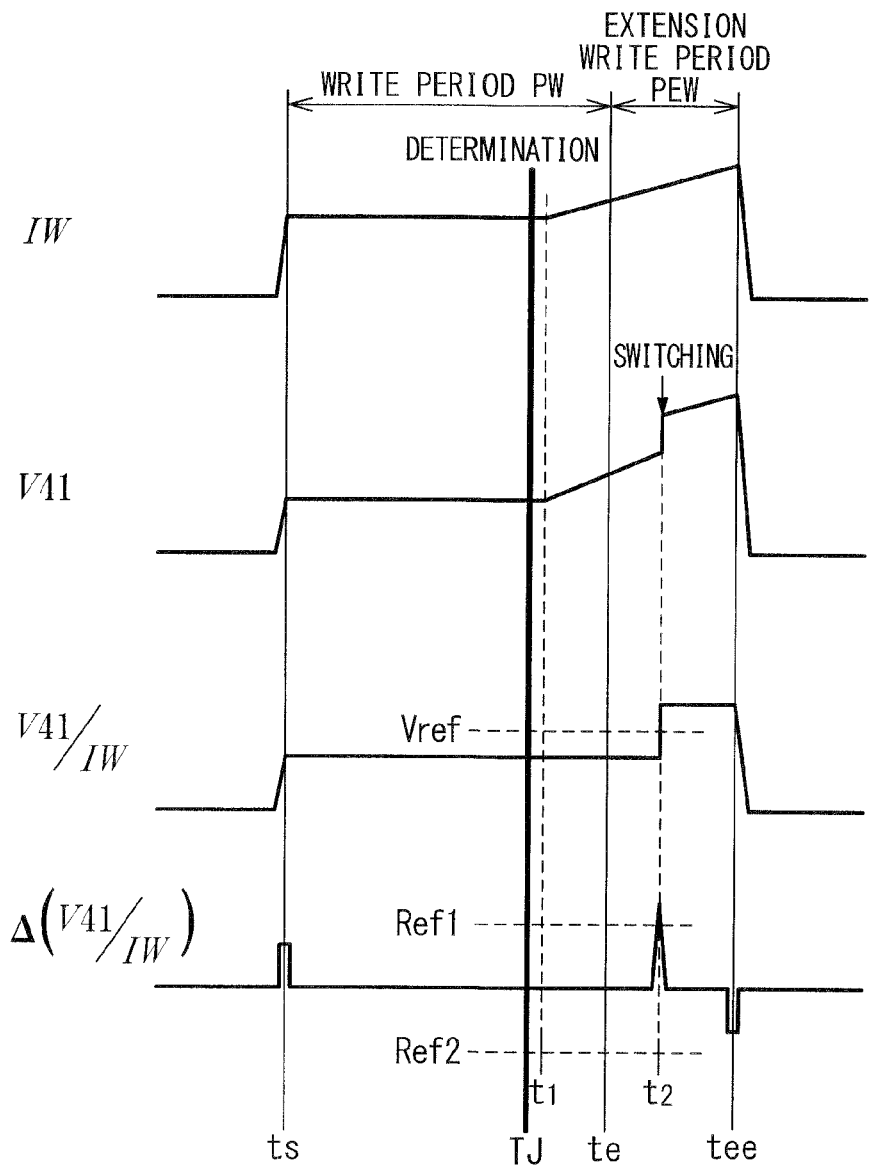
FIG. 20 is a timing chart showing another example of the write control according to the fourth embodiment.

FIG. 20 shows another example of the write control according to the present embodiment. It is assumed that the aforementioned determination is carried out at the predetermined timing TJ during the write period PW. In this example, the magnetization of the free layer 2 is not switched yet at the predetermined timing TJ. That is, the ratio (V41/IW) does not exhibit a value corresponding to the desired data at the timing TJ.

Accordingly, the monitor calculation unit 64 outputs the verifying result signal SV indicating "failure" to the write control circuit 50. In this case, the write control circuit 50 outputs instructions to the write current generating circuit 40 so as to extend the write period PW (step S4). The write control circuit 50 further outputs instructions to the write current generating circuit 40 so as to increase the write current IW. As a result, the write current IW starts to increase in terms of time from time t1 which is immediately after the timing TJ. Therefore, it is expected that the magnetization of the free layer 2 is easily switched.

The extended write period PEW is defined to be a period from the time te to time tee. The extended write period PEW is set to have, for example, one clock cycle. At time t2 of the extended write period PEW, the magnetization of the free layer 2 is switched and the ratio (V41/IW) is made larger than the reference value Vref. When the extended write period PEW finishes, it is also finished to supply the write current IW. The time differential value Δ (V41/IW) may also be used in the determination.

Figure 21:
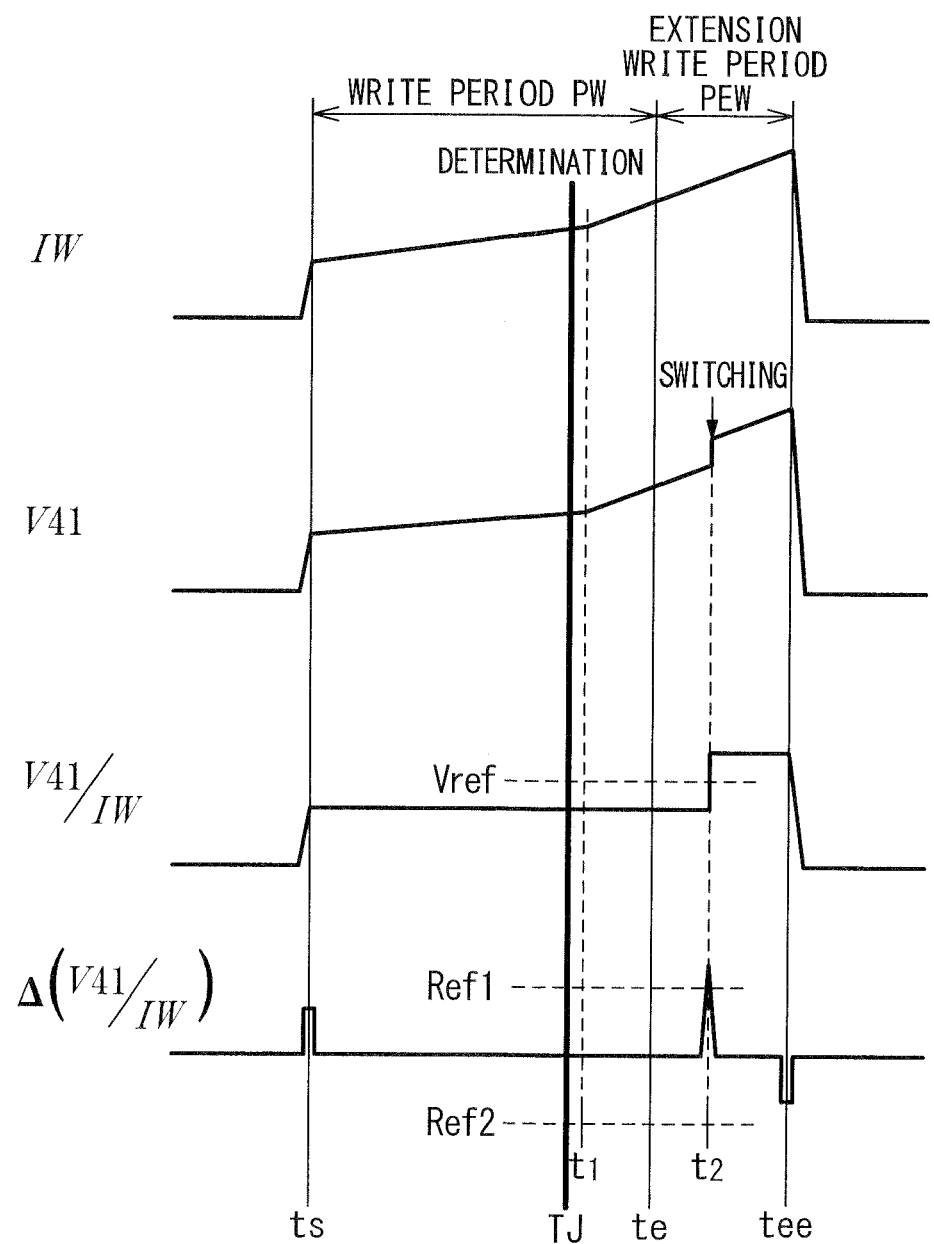
FIG. 21 is a timing chart showing another example of the write control according to the fourth embodiment.

FIG. 21 shows another example. In this example, the write current IW increases from the start of the write period PW. The write control circuit 50 then outputs instructions to the write current generating circuit 40 so as to extend the write period PW because the magnetization of the free layer 2 is not switched yet at a time point of the predetermined timing TJ (step S4). After time t1, the write current IW increases in terms of time. An increase rate of the write current IW obtained after the time t1 may also be set to be larger than an increase rate thereof obtained before the time t1. At time t2 during the extended write period PEW, the magnetization of the free layer 2 is switched, where the ratio (V41/IW) is made larger than the reference value Vref. When the extended write period PEW finishes, it is also finished to supply the write current IW. The time differential value Δ (V41/IW) may also be used in the determination.

(Failure Process: Rewrite)

Figure 22:
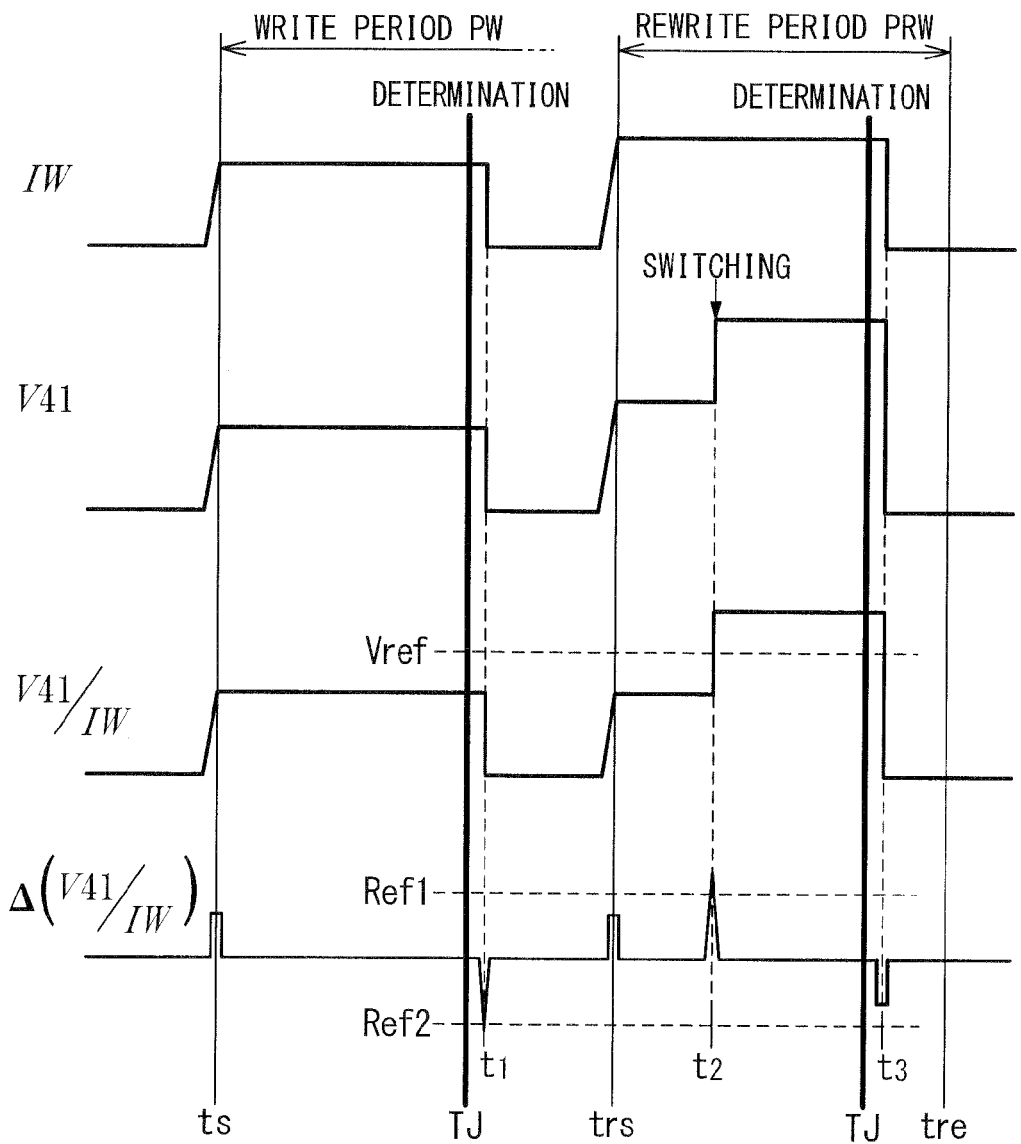
FIG. 22 is a timing chart showing another example of the write control according to the fourth embodiment.

FIG. 22 shows another example of the write control according to the present embodiment. It is assumed that the aforementioned determination is carried out at the predetermined timing TJ during the write period PW. In this example, the magnetization of the free layer 2 is not switched yet at the predetermined timing TJ. In this case, the write control circuit 50 outputs instructions to the write current generating circuit 40 so as to discontinue supplying the write current IW. At time t1, supplying the write current IW is forcibly finished. Following next is a write control which is executed again by the write control circuit 50 (step S4).

The rewrite period PRW is defined to be a period from time trs to time tre. The write control circuit 50 outputs instructions to the write current generating circuit 40 so as to supply the rewrite current IW during the rewrite period PRW. The write control circuit 50 here outputs instructions to the write current generating circuit 40 so that the rewrite current IW here is made to be larger than the write current IW during the write period PW. Therefore, it is expected that the magnetization of the free layer 2 is easily switched.

At time t2 during the rewrite period PRW, the magnetization of the free layer 2 is switched, where the ratio (V41/IW) is made larger than the reference value Vref. Thereafter, the aforementioned determination is carried out again at the predetermined timing TJ during the rewrite period PRW. In this case, the ratio (V4/IW) already exhibits a value corresponding to the desired data. Accordingly, the monitor calculation unit 64 outputs the verifying result signal SV indicting "pass" to the write control circuit 50. The write control circuit 50 instantly outputs instructions to the write current generating circuit 40 so as to finish supplying the rewrite current IW. At time t3, it is finished to supply the rewrite current IW. The time differential value Δ (V41/IW) may also be used in the determination.

Figure 23:
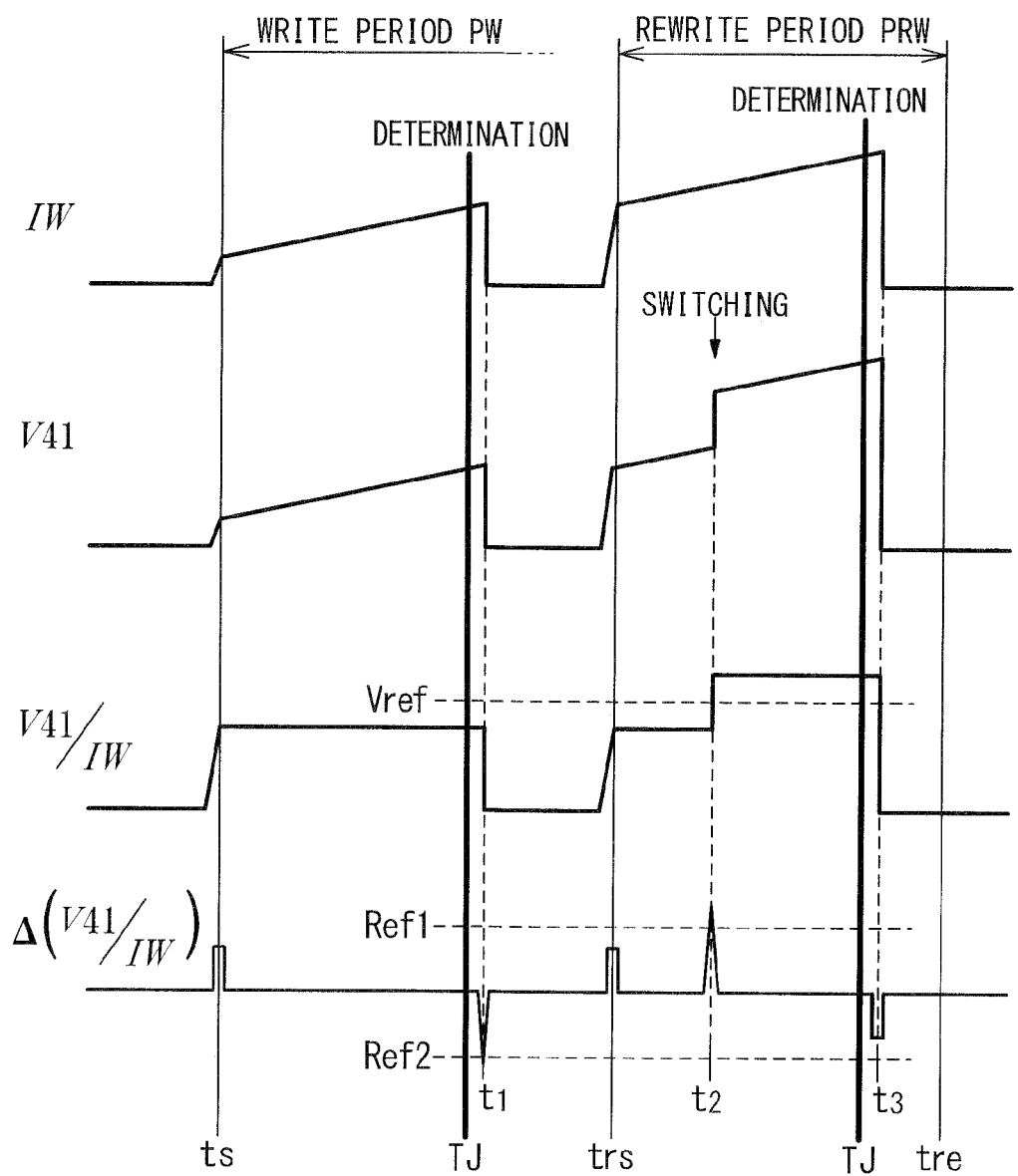
FIG. 23 is a timing chart showing another example of the write control according to the fourth embodiment.

FIG. 23 shows another example. In this example, the write current IW increases from the start of the write period PW. The write control circuit 50 then executes the rewrite control because the magnetization of the free layer 2 is not switched at the predetermined timing TJ (step S4). An initial value of the rewrite current IW is preferably set to be larger than an initial value of the write current IW. The rewrite current IW also increases during the rewrite period PRW. An increase rate of the rewrite current IW may also be set to be larger than an increase rate of the write current IW.

At time t2 during the rewrite period PRW, the magnetization of the free layer 2 is switched. Thereafter, at the predetermined timing TJ during the rewrite period PW, the aforementioned determination is carried out again.

In this case, the ratio (V41/IW) already exhibits a value corresponding to the desired data. Accordingly, the write control circuit 50 instantly outputs instructions to the write current generating circuit 40 so as to finish supplying the rewrite current IW. At time t3, it is finished to supply the rewire current IW.

The time differential value Δ (V41/IW) of the ratio (V41/IW) may also be used in the determination.

Such the rewrite process may be repeated for a predetermined number of times. In this case, the write process and the determination process are repeated alternately. The write current IW increases stepwise in accordance with repeating the write process. If the data is not written into the subject memory cell by the rewrite process which is repeated for the predetermined number of times, the subject memory cell is registered in a storage region as a failure cell (or failure bit). Thereafter, an alternative cell which is made to correspond to the failure cell is used in place of the failure cell.

4-3. Effects

According to the present embodiment, effects similar to those of the second embodiment can be obtained.

5. FIFTH EMBODIMENT

Figure 24:
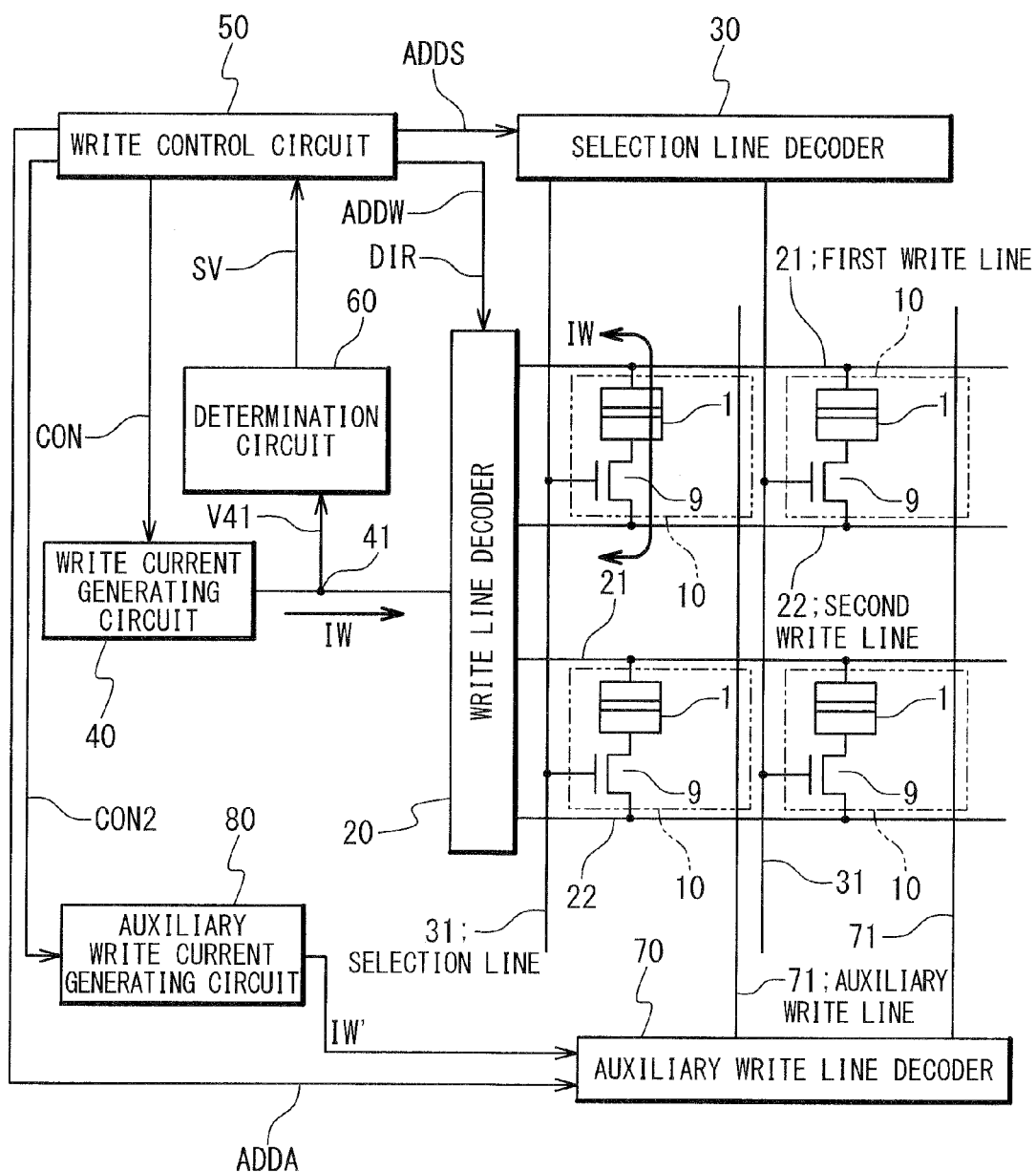
FIG. 24 is a circuit block diagram showing a configuration of the MRAM according to a fifth embodiment of the present invention.

FIG. 24 is a circuit block diagram showing a configuration of the MRAM of a fifth embodiment according to the present invention. In FIG. 24, the same reference letters as those of FIG. 3 refer to the same elements as those of FIG. 3, and explanation thereof will be appropriately omitted. The MRAM according to the present embodiment further includes an auxiliary write line 71. The auxiliary write line 71 is arranged in the vicinity of the magnetoresistance elements 1, and a magnetic field generated by a current flowing in the auxiliary write line 71 is applied to the magnetoresistance elements 1. That is, the auxiliary write line 71 is magnetically coupled with the magnetoresistance elements 1.

According to the present embodiment, when the above write current IW is supplied for spin transfer, an auxiliary write current IW' is simultaneously supplied to the auxiliary write line 71. A magnetic field generated by the auxiliary write current IW' serves as a bias magnetic field which provides support to write data.

That is, a desired data is written by cooperation between field writing and spin transfer writing. A direction of the auxiliary write current IW' is switched on the basis of the data which is written into a subject memory cell, and a direction of a bias magnetic field is also reversed on the basis of the data.

In order to provide such the auxiliary write current IW', the MRAM according to the present embodiment includes an auxiliary write line decoder 70 and an auxiliary write current generating circuit (or auxiliary current supplying circuit) 80. The auxiliary write line decoder 70 receives, from the write control circuit 50, an auxiliary write line address signal ADDA related to an address of the subject memory cell, and selects one auxiliary write line 71 in response to the signal ADDA. The auxiliary write current generating circuit 80 receives, from the write control circuit 50, a write control signal CON2 used for adjusting the auxiliary write current IW'. On the basis of the write control signal CON2, the auxiliary write current generating circuit 80 supplies the auxiliary write current IW' to the selected auxiliary write line 71, or leads-in the auxiliary write current IW' from the selected auxiliary write line 71, through the auxiliary write line decoder 70.

In the spin transfer method, the write current IW is vertically transferred to a film plane of the magnetoresistance element 1 in the write operation. If the write current IW is strong, it causes deterioration of the magnetoresistance elements 1 (i.e. tunnel barrier layers 3). According to the present embodiment, the bias magnetic field generated by the auxiliary write current IW' provides support to write data. Accordingly, it is made possible to suppress the magnitude of the write current IW used for spin transfer writing. Deterioration of the magnetoresistance elements 1 can be suppressed by reducing the write current IW as much as possible. The auxiliary circuits explained above can also be applied to any of the first to fourth embodiments already presented.

6. SUMMARY

As explained above, the MRAM in the spin transfer method and the operation method thereof according to the present invention make it possible to reduce power consumption. It is also made possible to reduce a probability of erroneous writing. An increase in an amount of time to write data can also be suppressed. It is further made possible to prevent reduction in an operation speed.

A configuration of the memory cell 10 and configurations of the peripheral circuits used for driving the memory cells 10 are not limited to the configurations shown in the above embodiments and can be appropriately designed by those who are skilled in the art. For example, one end of the magnetoresistance element 1 may be connected to a terminal circuit or other circuits in place of the write line. In this case, the write current generating circuit 40 may either supply the write current IW to the memory cells 10 or lead-in the write current IW from the memory cells 10.

An embodiment of the present invention is not limited to the above embodiments, and it is obvious that each of the embodiments can be appropriately modified or changed within scope of the technical ideas of the present invention.

The MRAM in the spin transfer method and the operation method thereof according to the present invention make it possible to reduce power consumption. It is also made possible to reduce a probability of erroneous writing. An increase in an amount of time to write data can also be suppressed. It is further made possible to prevent reduction in an operation speed.

The invention claimed is:

1. An operation method of a magnetic random access memory, comprising:
   (A) supplying a write current to a memory cell having a magnetoresistance element so as to write a desired data on the basis of a spin transfer method, said memory cell being a usual memory cell in a memory array and not a test memory cell; and
   (B) determining whether or not said desired data is written into said memory cell,
   wherein said step (B) is executed during a predetermined write period in which said write current is flowing in said step (A).

2. The operation method of a magnetic random access memory according to claim 1, further comprising:
   (C) finishing supply of said write current when determining that said desired data is written into said memory cell.

3. The operation method of a magnetic random access memory according to claim 1, wherein said write current is increased in terms of time in said step (A).

4. An operation method of a magnetic random access memory, comprising:
   (A) supplying a write current to a memory cell having a magnetoresistance element so as to write a desired data on the basis of a spin transfer method; and
   (B) determining whether or not said desired data is written into said memory cell,
   wherein said step (B) is executed during said step (A),
   wherein said step (B) includes:
      (B1) monitoring an electrical potential in a predetermined position of a wiring in which said write current flows, and
      (B2) carrying out said determination by comparing said electrical potential with a reference potential and detecting whether or not said electrical potential exhibits a value corresponding to said desired data.

5. The operation method of a magnetic random access memory according to claim 4, wherein said step (B2) is carried out during said step (A) in real time.

6. The operation method of a magnetic random access memory according to claim 5, further comprising:
   (D) extending a period of said step (A) when determining that said desired data is not written into said memory cell before said step (A) finishes.

7. The operation method of a magnetic random access memory according to claim 5, further comprising:
   (E) rewriting said desired data into said memory cell when determining that said desired data is not written into said memory cell before said step (A) finishes.

8. The operation method of a magnetic random access memory according to claim 4, wherein said step (B2) is carried out at a predetermined timing during said step (A).

9. The operation method of a magnetic random access memory according to claim 8, further comprising:
   (D) extending a period of said step (A) when determining that said desired data is not written into said memory cell at said predetermined timing.

10. The operation method of a magnetic random access memory according to claim 8, further comprising:
    (E1) finishing said step (A) when determining that said desired data is not written into said memory cell at said predetermined timing; and
    (E2) rewriting said desired data into said memory cell.

11. An operation method of a magnetic random access memory, comprising:
(A) supplying a write current to a memory cell having a magnetoresistance element so as to write a desired data on the basis of a spin transfer method; and
(B) determining whether or not said desired data is written into said memory cell,
wherein said step (B) is executed during said step (A),
wherein said step (B) includes:
(B1) calculating a ratio between an electrical potential in a predetermined position of a wiring in which said write current flows and said write current, and
(B2) carrying out said determination by comparing said ratio with a reference value and detecting whether or not said ratio exhibits a value corresponding to said desired data.

12. The operation method of a magnetic random access memory according to claim 11, wherein said step (B2) is carried out during said step (A) in real time.

13. The operation method of a magnetic random access memory according to claim 12, further comprising:
(D) extending a period of said step (A) when determining that desired data is not written into said memory cell before said step (A) finishes.

14. The operation method of a magnetic random access memory according to claim 13, wherein said write current is increased in terms of time in said step (D).

15. The operation method of a magnetic random access memory according to claim 12, further comprising:
(E) rewriting said desired data into said memory cell by supplying a rewrite current to said memory cell when determining that said desired data is not written into said memory cell before said step (A) finishes.

16. The operation method of a magnetic random access memory according to claim 15, wherein said rewrite current in said step (E) is larger than said write current in said step (A).

17. The operation method of a magnetic random access memory according to claim 15, wherein said rewrite current increases in terms of time in said step (E).

18. The operation method of a magnetic random access memory according to claim 11, wherein said step (B2) is carried out at a predetermined timing during said step (A).

19. The operation method of a magnetic random access memory according to claim 18, further comprising:
(D) increasing said write current in terms of time when determining that desired data is not written into said memory cell at said predetermined timing.

20. The operation method of a magnetic random access memory according to claim 18, further comprising:
(D) extending a period of said step (A) when determining that said desired data is not written into said memory cell at said predetermined timing.

21. The operation method of a magnetic random access memory according to claim 18, further comprising:
(E1) finishing said step (A) when determining that said desired data is not written into said memory cell at said predetermined timing; and
(E2) rewriting said desired data into said memory cell by supplying a rewrite current to said memory cell.

22. The operation method of a magnetic random access memory according to claim 21, wherein said rewrite current in said step (E2) is larger than said write current in said step (A).

23. The operation method of a magnetic random access memory according to claim 21, wherein said rewrite current is increased in terms of time in said step (E2).

24. The operation method of a magnetic random access memory according to claim 11, wherein said write current is increased in terms of time in said step (A).

25. An operation method of a magnetic random access memory, comprising:
(A) supplying a write current to a memory cell having a magnetoresistance element so as to write a desired data on the basis of a spin transfer method; and
(B) determining whether or not said desired data is written into said memory cell; and
(F) applying a bias magnetic field corresponding to said desired data to said magnetoresistance elements at the same time with said step (A),
wherein said step (B) is executed during said step (A).

26. An MRAM using a spin transfer method, comprising:
a memory cell including a magnetoresistance element, said memory cell being a usual memory cell in a memory array and not a test memory cell;
a current supply circuit supplying, to said magnetoresistance element, a write current in a direction corresponding to a data to be written into said memory cell; and
a controller controlling supply of said write current from said current supply circuit,
wherein said controller determines whether or not said data is written into said memory cell during a predetermined write period in which said write current is flowing.

27. The MRAM according to claim 26, wherein said controller instructs said current supply circuit to finish supplying said write current when determining that said data is written into said memory cell.

28. The MRAM according to claim 26, wherein said controller instructs said current supply circuit to increase said write current in terms of time during said predetermined write period.

29. An MRAM using a spin transfer method, comprising:
a memory cell including a magnetoresistance element;
a current supply circuit supplying, to said magnetoresistance element, a write current in a direction corresponding to a data to be written into said memory cell; and
a controller controlling supply of said write current from said current supply circuit,
wherein said controller determines whether or not said data is written into said memory cell during a predetermined write period in which said write current is supplied,
wherein said controller includes:
a comparator comparing an electrical potential in a predetermined position of a wiring in which said write current flows with said reference potential,
wherein said comparator carries out said determination in real time by detecting whether or not said electrical potential exhibits a value corresponding to said data on the basis of said comparison.

30. The MRAM according to claim 29, wherein when determining that said data is not written into said memory cell before said predetermined write period finishes, said controller instructs said current supply circuit to extend a period in which said write current is supplied.

31. The MRAM according to claim 29, wherein when determining that said data is not written into said memory cell before said predetermined write period finishes, said controller instructs said current supply circuit to supply said write current again.

32. An MRAM using a spin transfer method, comprising:
a memory cell including a magnetoresistance element;
a current supply circuit supplying, to said magnetoresistance element, a write current in a direction corresponding to a data to be written into said memory cell; and a controller controlling supply of said write current from said current supply circuit, wherein said controller determines whether or not said data is written into said memory cell during a predetermined write period in which said write current is supplied, wherein said controller includes:

a potential monitor monitoring an electrical potential in a predetermined position of a wiring in which said write current flows, wherein said controller carries out said determination by determining whether or not said electrical potential exhibits a value corresponding to said data at a predetermined timing during said predetermined write period.

33. The MRAM according to claim 32, wherein when determining that said data is not written into said memory cell at said predetermined timing, said controller instructs said current supply circuit to extend a period in which said write current is supplied.

34. The MRAM according to claim 32, wherein when determining that said data is not written into said memory cell at said predetermined timing, said controller instructs said current supply circuit to supply said write current again after finishing supply of said write current.

35. An MRAM using a spin transfer method, comprising:

a memory cell including a magnetoresistance element;

a current supply circuit supplying, to said magnetoresistance element, a write current in a direction corresponding to a data to be written into said memory cell; and a controller controlling supply of said write current from said current supply circuit, wherein said controller determines whether or not said data is written into said memory cell during a predetermined write period in which said write current is supplied, wherein said controller includes:

a calculating unit calculating a ratio between an electrical potential in a predetermined position of a writing in which said write current flows and said write current so as to compare said ratio with a reference value, wherein said calculating unit carries out said determination in real time by detecting whether or not said ratio exhibits a value corresponding to said data on the basis of said comparison.

36. The MRAM according to claim 35, wherein when determining that said data is not written into said memory cell before said predetermined write period finishes, said controller instructs said current supply circuit to extend a period in which said write current is supplied.

37. The MRAM according to claim 36, wherein said controller instructs said current supply circuit to increase said write current in terms of time in an extended period.

38. The MRAM according to claim 35, wherein when determining that said data is not written into said memory cell before said predetermined write period finishes, said controller instructs said current supply circuit to supply said rewrite current.

39. The MRAM according to claim 38, wherein said rewrite current is larger than said write current.

40. The MRAM according to claim 38, wherein said controller instructs said current supply circuit to increase said rewrite currents in terms of time.

41. An MRAM using a spin transfer method, comprising:

a memory cell including a magnetoresistance element;

a current supply circuit supplying, to said magnetoresistance element, a write current in a direction corresponding to a data to be written into said memory cell; and a controller controlling supply of said write current from said current supply circuit, wherein said controller determines whether or not said data is written into said memory cell during a predetermined write period in which said write current is supplied, wherein said controller includes:

a calculating unit calculating a ratio between an electrical potential in a predetermined position of said wiring in which said write current flows and said write current, wherein said controller carries out said determination by judging whether or not said ratio exhibits a value corresponding to said data at a predetermined timing during said predetermined write period.

42. The MRAM according to claim 41, wherein when determining that said data is not written into said memory cell at said predetermined timing, said controller instructs said current supply circuit to increase said write current in terms of time.

43. The MRAM according to claim 41, wherein when determining that said data is not written into said memory cell at said predetermined timing, said controller instructs said current supply circuit to extend a period to supply said write current.

44. The MRAM according to claim 41, wherein when determining that said data is not written into said memory cell at said predetermined timing, said controller instructs said current supply circuit to supply said rewrite current after finishing supply of said write current.

45. The MRAM according to claim 44, wherein said rewrite current is larger than said write current.

46. The MRAM according to claim 44, wherein said controller instructs said current supply circuit to increase said rewrite current in terms of time.

47. The MRAM according to claim 35, wherein said controller instructs said current supply circuit to increase said write current in terms of time during said predetermined write period.

48. An MRAM using a spin transfer method, comprising:

a memory cell including a magnetoresistance element;

a current supply circuit supplying, to said magnetoresistance element, a write current in a direction corresponding to a data to be written into said memory cell; and a controller controlling supply of said write current from said current supply circuit, a write line magnetically coupled with said magnetoresistance element; and an auxiliary current supply circuit supplying an auxiliary write current to said write line, wherein said controller determines whether or not said data is written into said memory cell during a predetermined write period in which said write current is supplied, wherein a magnetic field generated by said auxiliary write current is applied to said magnetoresistance element, and said controller instructs said auxiliary current supply circuit to supply an auxiliary write current simultaneously with supply of said write current.

* * * * *